(12) United States Patent
Singh et al.

(10) Patent No.: US 7,601,652 B2
(45) Date of Patent: *Oct. 13, 2009

(54) METHOD FOR TREATING SUBSTRATES AND FILMS WITH PHOTOEXCITATION

(75) Inventors: Kaushal K. Singh, Santa Clara, CA (US); Sean M. Seutter, San Jose, CA (US); Jacob Smith, Santa Clara, CA (US); R. Suryanarayanan Iyer, Santa Clara, CA (US); Steve G. Ghanayem, Los Altos, CA (US); Adam Brailove, Gloucester, MA (US); Robert Shydo, Andover, MA (US); Jeannot Morin, Intervale, NH (US)

(73) Assignee: Applied Materials, Inc., Santa Clara, CA (US)

( * ) Notice: Subject to any disclaimer, the term of this patent is extended or adjusted under 35 U.S.C. 154(b) by 555 days.

This patent is subject to a terminal disclaimer.

(21) Appl. No.: 11/157,567

(22) Filed: Jun. 21, 2005

(65) Prior Publication Data

US 2006/0286820 A1 Dec. 21, 2006

(51) Int. Cl.
 *H01L 21/31* (2006.01)
(52) U.S. Cl. .......................... 438/792; 438/791
(58) Field of Classification Search .................. None
 See application file for complete search history.

(56) References Cited

U.S. PATENT DOCUMENTS

| | | |
|---|---|---|
| 4,720,395 A | 1/1988 | Foster |
| 4,857,139 A | 8/1989 | Tashiro et al. |
| 5,648,114 A | 7/1997 | Paz De Araujo et al. |
| 5,716,495 A | 2/1998 | Butterbaugh et al. |
| 6,265,033 B1 | 7/2001 | Hilliard |
| 7,125,582 B2 | 10/2006 | McSwiney et al. |
| 2002/0016084 A1 | 2/2002 | Todd |
| 2003/0104707 A1 | 6/2003 | Senzaki et al. |
| 2003/0140941 A1 | 7/2003 | Inushima et al. |
| 2003/0207547 A1 | 11/2003 | Wang et al. |
| 2003/0215570 A1 | 11/2003 | Seutter et al. |
| 2004/0069610 A1 | 4/2004 | Arno et al. |
| 2004/0121085 A1 | 6/2004 | Wang et al. |
| 2004/0164293 A1 | 8/2004 | Maloney et al. |

(Continued)

OTHER PUBLICATIONS

Iyer, et al., U.S. Appl. No. 11/245,373, filed Oct. 6, 2005.
Smith, et al., U.S. Appl. No. 11/245,758, filed Oct. 7, 2005.
Wang, et al., U.S. Appl. No. 11/155,646, filed Jun. 17, 2005.
Migitaka, "Excellent Silicon Nitride Films Made by Hybrid Process and Their Application to a-Si TFTS", Semioconductor Conference, 2000, CAS 2000 Proceedings, 2000 IEEE, pp. 23-32, vol. 1.

(Continued)

*Primary Examiner*—Zandra V. Smith
*Assistant Examiner*—Pamela E Perkins
(74) *Attorney, Agent, or Firm*—Patterson & Sheridan, LLP

(57) ABSTRACT

Embodiments of the invention generally provide a method for depositing films using photoexcitation. The photoexcitation may be utilized for at least one of treating the substrate prior to deposition, treating substrate and/or gases during deposition, treating a deposited film, or for enhancing chamber cleaning. In one embodiment, a method for depositing silicon and nitrogen-containing film on a substrate includes heating a substrate disposed in a processing chamber, generating a beam of energy of between about 1 to about 10 eV, transferring the energy to a surface of the substrate; flowing a nitrogen-containing chemical into the processing chamber, flowing a silicon-containing chemical with silicon-nitrogen bonds into the processing chamber, and depositing a silicon and nitrogen-containing film on the substrate.

18 Claims, 9 Drawing Sheets

U.S. PATENT DOCUMENTS

2004/0194706 A1   10/2004   Wang et al.
2005/0082001 A1    4/2005   Sugiura
2005/0145177 A1    7/2005   McSwiney et al.
2005/0241567 A1   11/2005   Scarlete et al.
2005/0255714 A1   11/2005   Iyer et al.
2006/0286819 A1*  12/2006   Seutter et al. ............... 438/791
2007/0275193 A1   11/2007   Desimone et al.

OTHER PUBLICATIONS

Bergonzo, et al., "Low pressure photodeposition of silicon nitride films using a xenon excimer lamp", Appl. Phys. Lett. 63 (13), Sep. 1993, p. 1757-1759.

PCT International Search Report for PCT/US06/23915 dated Jul. 14, 2008 (APPM/7647PCT).

* cited by examiner

METHOD FOR TREATING SUBSTRATES AND FILMS WITH PHOTOEXCITATION

RELATED APPLICATION

This application is related to comtemporality filed U.S. patent application Ser. No. 11/157,533, entitled METHOD FOR SILICON BASED DIELECTRIC DEPOSITION AND CLEAN WITH PHOTOEXCITATION, by Seutter, et al., which is incorporated by reference in its entirety.

BACKGROUND OF THE INVENTION

1. Field of the Invention

Embodiments of the invention generally relate to a method for depositing silicon-containing materials, and more particularly, embodiments of the invention relate to chemical vapor deposition techniques for thermally depositing silicon based dielectric materials, such as silicon nitride, using photoexcitation.

2. Description of the Related Art

Thermal chemical vapor deposition (CVD) of silicon-containing films, such as silicon nitride, is a state of the art, front end process used during semiconductor device manufacturing. For example, in a thermal CVD process for depositing silicon nitride, thermal energy is utilized for breaking one or more feedstock chemicals, which includes a silicon precursor, to make a thin film of a silicon nitride on a substrate surface. Conventional thermal CVD of silicon-containing materials is typically performed in a batch furnace or in a single wafer deposition chamber operating at elevated temperatures typically in excess of 550 degrees Celsius. As device geometries shrink to enable faster integrated circuits, the thermal budget for deposited films must be reduced in order to obtain satisfactory processing results, good production yield and robust device performance. Although some thermal CVD processes for silicon-containing materials having deposition temperatures less than 550 degrees Celsius have been proposed, none have exhibited production worthiness suitable for large scale utilization in semiconductor device fabrication. More recently, atomic/alternating layer deposition (ALD) or cyclic layer deposition (CLD) methods have been developed for depositing silicon-containing films such as silicon nitride. While these methods have enabled a reduction in processing temperatures to about 550 degrees Celsius or less, film growth rates have been extremely low.

Thus, there is a need for an improved method of depositing silicon-containing materials, such as silicon nitride, at a temperature less than about 550 degrees Celsius with adequate deposition/growth rates.

SUMMARY OF THE INVENTION

Embodiments of the invention generally provide a method for depositing films using photoexcitation. The photoexcitation may be utilized for at least one of treating the substrate prior to deposition, treating substrate and/or gases during deposition, treating a deposited film, or for enhancing chamber cleaning. The photoexcitation may be used to enhance various processing attributes, such as removing native oxides prior to deposition, removing volatiles from deposited films, increasing surface energy, increasing the excitation energy of precursors, and the like.

In one embodiment, a method for depositing silicon and nitrogen-containing film on a substrate includes heating a substrate disposed in a processing chamber, generating a beam of energy of between about 1 to about 10 eV, transferring the energy to a surface of the substrate, flowing a nitrogen-containing chemical into the processing chamber, flowing a silicon-containing chemical with silicon-nitrogen bonds into the processing chamber, and depositing a silicon and nitrogen-containing film on the substrate.

In another embodiment, a method for depositing silicon and nitrogen-containing film on a substrate includes heating a substrate disposed in a processing chamber, generating a beam of energy of between about 1 to about 10 eV, flowing a nitrogen-containing chemical into the processing chamber, flowing a silicon-containing chemical with silicon-nitrogen bonds into the processing chamber, depositing a silicon and nitrogen-containing film on the substrate, and transferring the energy into the processing chamber during deposition of the film. In a variation of the above two embodiments, the silicon-containing chemical can be any of the family of silyl azides, silyl hydrazine, bis-tertbutylaminosilane (BTBAS), hexachlorodisilane, amino(di)silanes, silyl azides, silyl hydrazines, hydrogen azide, hydrazine, and methyl hydrazine materials, among others.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
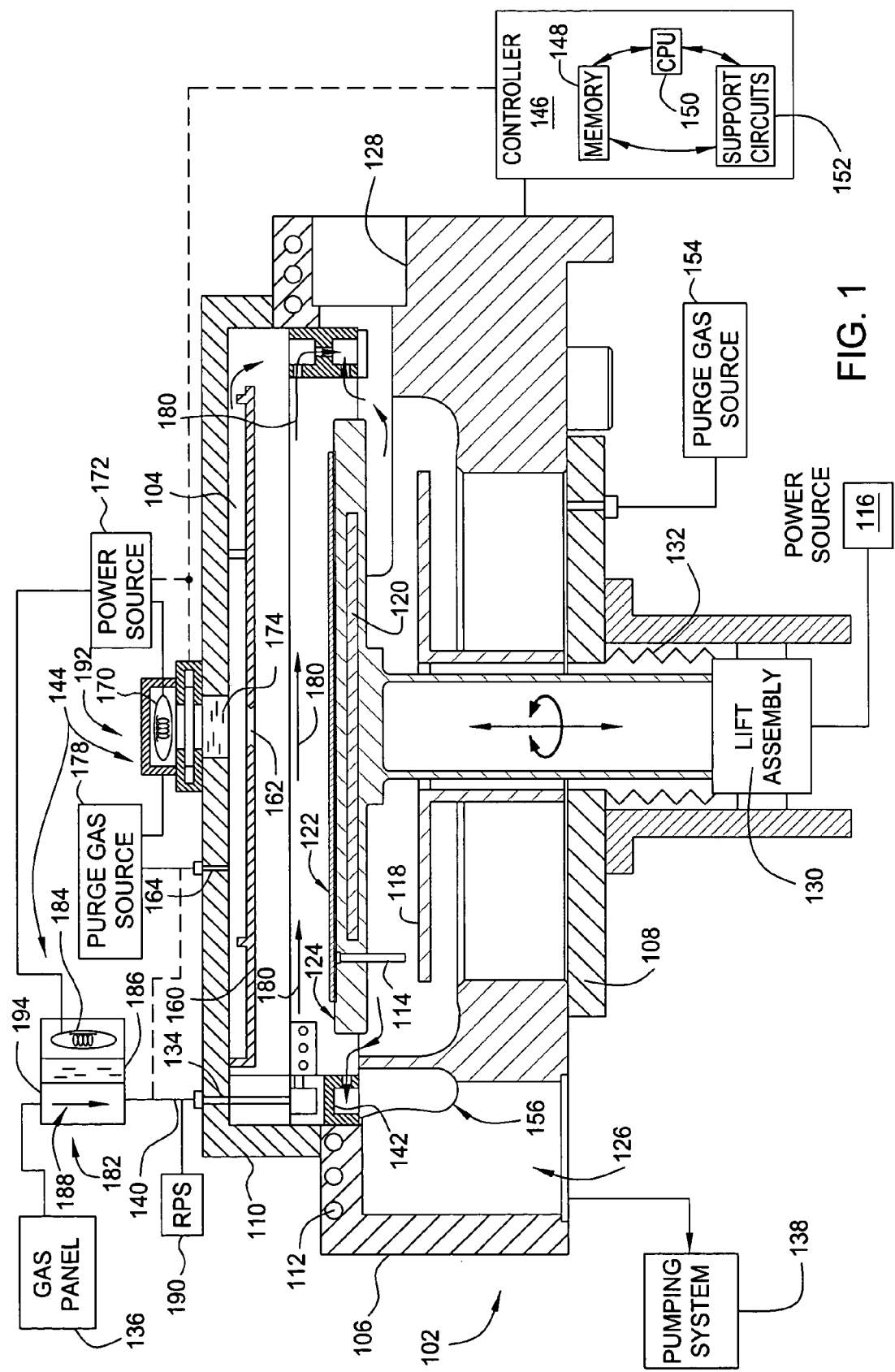
FIG. 1 is a simplified cross sectional view of one embodiment of a deposition chamber in which a method of depositing silicon nitride of the present invention may be performed.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Embodiments of the invention provide a method for depositing a silicon-containing film, such as silicon nitride and the like, on a substrate. Many of the embodiments described herein may be advantageously performed utilizing temperatures less than about 550 degrees Celsius. Although the invention is described with reference to a single wafer thermal-chemical vapor deposition (processing) chamber 100 illustrated in FIG. 1, it is contemplated that the method may be beneficially practiced in other deposition systems. One processing chamber which may be adapted to benefit from the invention is a SiNgen®Plus chamber, available from Applied Materials, Inc., of Santa Clara, Calif. Moreover, although a silicon nitride deposition process is described below, it is contemplated that the method and apparatus utilized to perform the method may be beneficially adapted to deposit materials in addition to silicon nitride, such as metal silicide and metal nitride, among others.

Besides thermal-CVD, other useful processes to deposit silicon nitride materials include pulsed-CVD and atomic layer deposition (ALD). During a pulsed-CVD process, reagents, such as a silicon precursor and a reactant, are co-flowed and pulsed into the process chamber. During an ALD process, reagents, such as a silicon precursor and a reactant, are individually and sequentially pulsed into the process chamber. Plasma enhanced deposition techniques may be used during either ALD or CVD processes. Silicon-containing materials may be deposited to a single substrate or a batch of substrates during the deposition processes described herein.

In the embodiment of FIG. 1, the processing chamber 100 includes a chamber body 102 coupled to a pumping system 138, a controller 146, at least one photoexcitation system 144 and a gas panel 136. The chamber body 102 has walls 106, a bottom 108, and a lid 110 that define an internal volume 104. The walls 106 of the body 102 may be thermally regulated. In one embodiment, a plurality of conduits 112 are disposed in the walls 106 and are configured to circulate a heat transfer fluid that regulates the temperature of the chamber body 102. The walls 106 additionally include a substrate access port 128 configured to facilitate entry and egress of a workpiece, such as a substrate 122, from the processing chamber 100.

A substrate support pedestal 124 is disposed in the internal volume 104 of the chamber body 102 and supports the substrate 122 during processing. The substrate support pedestal 124 includes a heater 120 configured to regulate the temperature of the substrate 122 and/or heat the interior volume 104 of the processing chamber 100. In the embodiment depicted in FIG. 1, the heater 120 is a resistive heating element coupled to a power source 116 and is capable of heating the substrate to a temperature of at least 550 degrees Celsius.

A pedestal lift assembly 130 is coupled to the substrate support pedestal 124 and is configured to control the elevation of the pedestal 124 between an elevated processing position (as shown in FIG. 1) and a lowered position that facilitates access to the substrate 122 disposed on the pedestal 124 through the substrate access port 128. The pedestal lift assembly 130 is sealingly coupled to the bottom 108 of the chamber body 102 by a flexible bellows 132. Optionally, the pedestal lift assembly 130 may be configured to rotate the pedestal 124 during processing. One pedestal lift assembly 130 which may be adapted to benefit from the invention is described in U.S. patent Ser. No. 11/147,938, filed Jun. 8, 2005, entitled "Rotating Substrate Support and the Methods of Use," by J. Smith, et al, which is hereby incorporated by reference in its entirety. The pedestal lift assembly 130 may be configured to rotate the pedestal 124 continuously at a constant rate, rotate the pedestal 124 continuously at different rates, or to index the pedestal 124.

The gas panel 136 is coupled to the processing chamber 100 and is configured to provide process chemicals, in liquid and/or gaseous form, and other gases to the internal volume 124 of the chamber body. In the embodiment depicted in FIG. 1, the gas panel 136 is coupled by a gas line 140, which is used to transfer process chemical or mixed process gases or vapors from liquid injector generated from a selected liquid chemical source, to an inlet port 134 formed in the lid 110 of the chamber body 102. It is contemplated that the inlet port 134 may be formed through one or more other locations of the chamber body 102.

A flow control ring 142 is disposed in the body 102 and is coupled to the port 134. The flow control ring 142 is configured to direct a flow of process across the substrate 122 supported on the pedestal 124 as shown by arrows 180. The flow control ring 142 is additionally configured to maintain a flow of purge gas, provided to a portion of the interior volume 104 defined below the pedestal 124 from a purge gas source 154, flowing upwards around the lower edge of the pedestal 124, thereby preventing deposition gases from entering the region below the pedestal 124. Gases exiting the flow control ring 142 are generally collected in a pumping channel 156 prior to removal from the chamber 100 through a pumping port 126 by the pumping system 138. The pumping system 138 generally includes a throttle valve and one or more pumps arranged to control the pressure within the internal volume 104 of the processing chamber 100. The flow control ring 142 is further detailed below with reference to FIGS. 2 and 3A-D.

Lift pins 114 (of which one is shown in FIG. 1) are provided to separate the substrate 122 from the upper surface of the substrate support pedestal 124 to facilitate substrate hand-off with a robot (not shown) entering the chamber body through the access port 128. In the embodiment depicted in FIG. 1, a lift plate 118 is disposed below the substrate support pedestal 124 and arranged such that as the pedestal 124 is lowered, the lift pins 114 come in contact with the lift plate 118 before the pedestal 124 has completed its downward travel. The lift plate 118 supports the lift pins 114 as the pedestal 124 continues downward, causing the lift pins 114 to extend from the upper surface of the pedestal. The position of the lift plate 118 and/or the length of the lift pins 114 are configured such that the substrate 122 becomes spaced-apart from the substrate support pedestal 124 and generally aligned with the access port 128 when the pedestal 124 is in the lowered position.

The photoexcitation system 144 is positioned to provide energy to at least one of the process gases or the surface of the substrate 122. In one embodiment, the photoexcitation system 144 includes at least one of a remote photoexcitation system 182 or a direct photoexcitation system 192. Although the embodiment depicted in FIG. 1 includes both a remote photoexcitation system 182 and a direct photoexcitation system 192, it is contemplated that chamber 100 may optionally be configured with a single photoexcitation system (i.e., either the system 182 or 192). The energy from the photoexcitation system 144 may be utilized in a number of ways. For example, the energy may be utilized to remove native oxides from the surface of the substrate 122 prior to deposition, to increase the energy of the process gases, thus, increasing deposition rates while reducing deposition temperatures, and to increase the energy level of the deposited materials, thereby increasing deposition rates, allowing greater mobility of atoms within the film and assisting in the reduction of hydrogen or other volatile materials within the film.

In one embodiment, the direct photoexcitation system 192 generally includes at least one lamp 170 positioned to deliver a beam or flux of energy to substrate surface. The flux of energy can be delivered in a continuous mode or in a pulsed mode. The lamp 170 may additionally be utilized to energize process and/or cleaning gases.

The direct photoexcitation system 192 is positioned above one or more windows 174 disposed in the lid 110, such that energy emitted from the photoexication system 144 may be directed into the internal volume 104 of the chamber 100. A power source 172 is coupled to the lamp 170 and selectively controls the energy emitted from the lamp in a range of between about 1 and about 10 eV, and at a frequency between about 100 to about 480 nm. In one embodiment, the lamp 170 is an excimer lamp.

In another embodiment, the lamp 170 may include one or more lamps that generate energy at different wavelengths. Thus, different lamps may be energized at different times during a process to produce a desired energy level. The lamps 170 may also be pulsed. The energy at different wavelengths may be produced simultaneously, or at different times during processing.

The window 174 is generally sealed to the lid 110 in a manner that prevents vacuum leakage. The window 174 is fabricated from a material transmissive to the energy emitted from the lamp 170 while being substantially compatible with process chemistries. In one embodiment, the window 174 is fabricated from sapphire or magnesium fluoride.

To protect the window 174 from deposition, a baffle plate 160 is provided below the lid 110 to direct a blanket of purge gas between the window 174 and the substrate 122 disposed on the pedestal 124. The baffle plate 160 includes an aperture that is aligned with the window 174 to allow the beam or flux of energy from the lamp 170 to impinge upon the substrate and/or gases within the internal volume 104 of the processing chamber 100. A shutter plate can be added below or above the window 174 that can be open or shut to achieve a pulsing of the beam on the surface of the substrate. A purge gas source 178 is coupled to a purge gas inlet 164 formed through the chamber 100 and provides a purge gas to the region between the lid 110 and baffle plate 160. Additional details of the direct photoexcitation system 192, lid 110, window 174 and the baffle plate 160 are described further below with reference to FIGS. 4-8.

Figure 2:
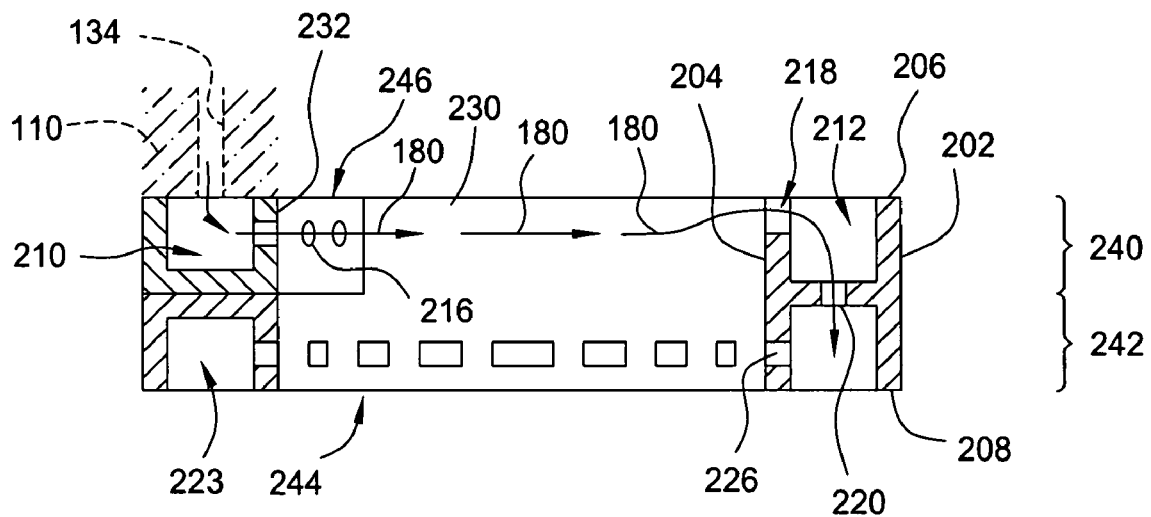
FIG. 2 is a sectional view of one embodiment of a flow control ring.
Figure 3A:
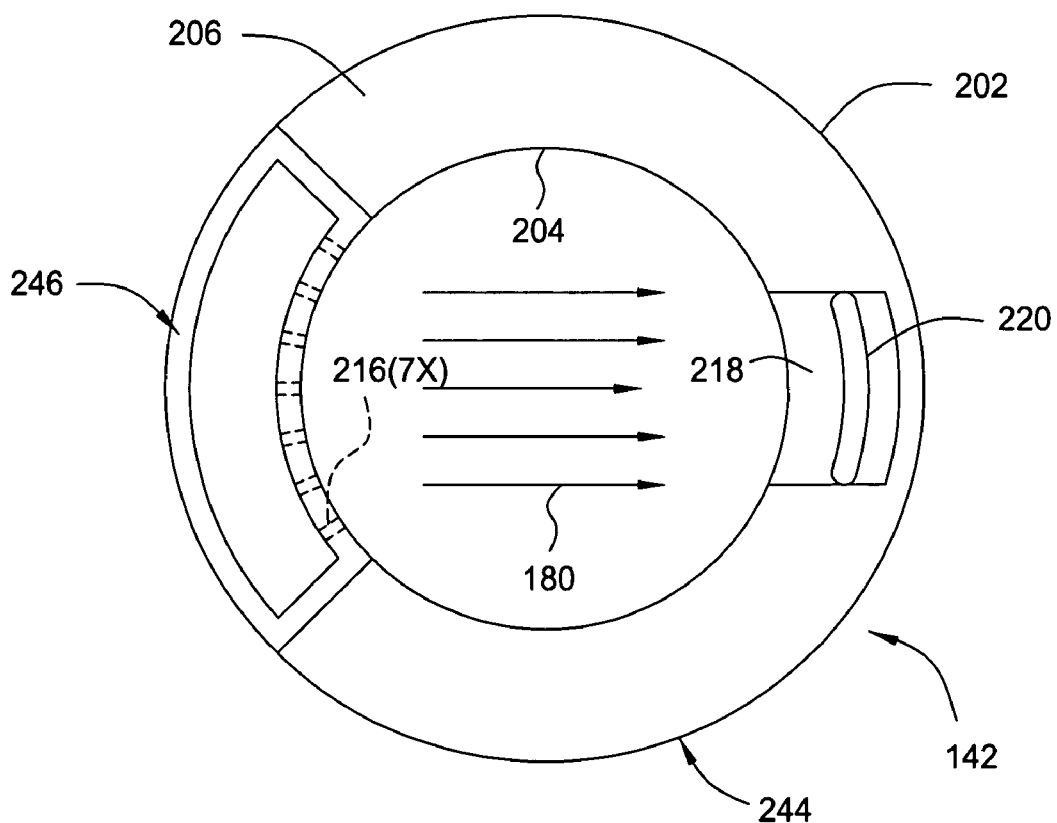
FIGS. 3A-B are top and bottom views of the flow control ring of FIG. 2.
Figure 3B:
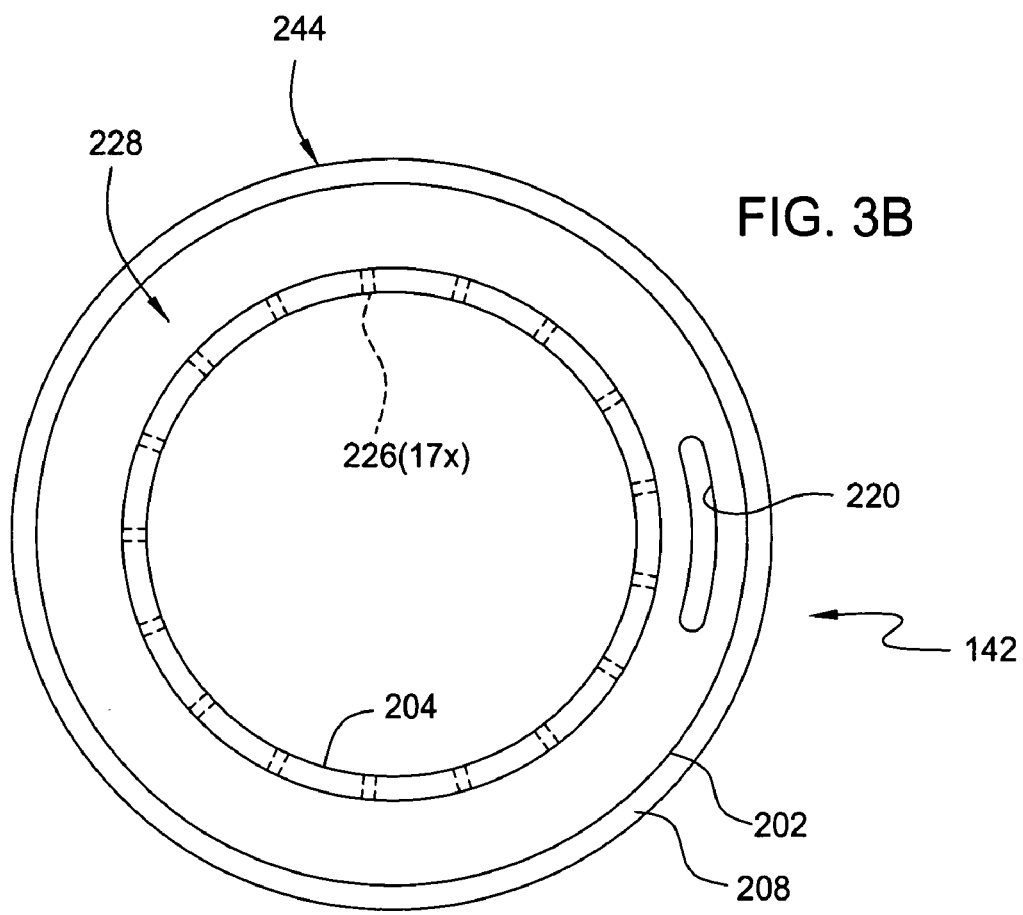
Figures 5A, 5B:
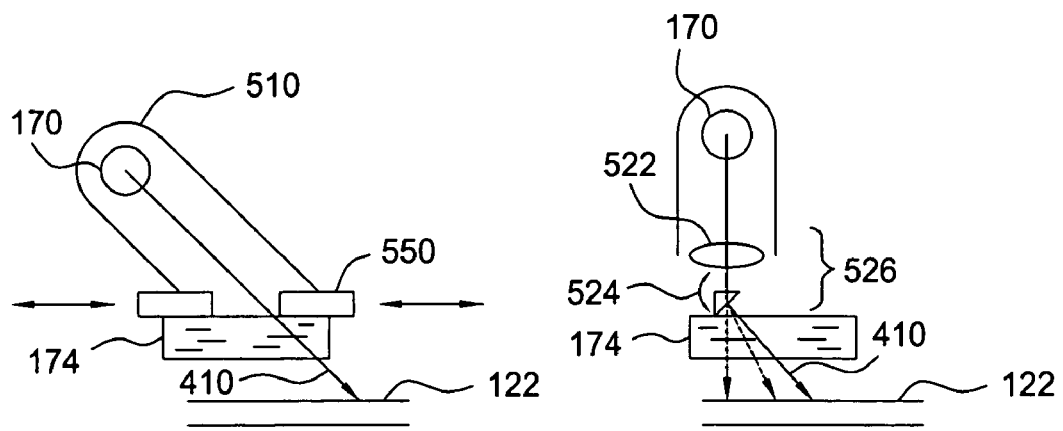
FIGS. 5A-B illustrate schematics of apparatus for directing an energy beam or flux on a substrate.

FIGS. 2 and 3A-B are sectional and bottom views of one embodiment of the flow control ring 142. The flow control ring 142 has an outer side 202, an inner side 204, a top 206 and a bottom 208, and is fabricated from a material compatible with the process chemistries, such as aluminum, anodized aluminum, among others. In the embodiment depicted in FIGS. 2 and 3A-B, the flow control ring 142 is shown fabricated from a main body 244 having an insert 246 coupled thereto. It is contemplated that the flow control ring 142 may alternatively be fabricated as a since piece member, be assembled into a unitary body, or comprise multiple sections held together within the processing chamber 100.

Three plenums are defined within the flow control ring 142. An upper portion 240 of the flow control ring 142 includes an inlet plenum 210 and an outlet plenum 212. The inlet plenum 210 is separated from the outlet plenum 212 by a wall 230. In one embodiment, the wall 230 spaces the inlet plenum 210 and the outlet plenum 212 to opposite sides of the ring 142.

A pumping plenum 214 is disposed in a lower portion 242 of the flow control ring 142 and is separated from the plenums 210, 212 by an interior wall 228. The pumping plenum 214 is substantially annular, circumscribing the inner wall 204 of the flow control ring 142.

One or more inlet ports 216 are formed through the inner wall 204 of the flow control ring 142. In the embodiment depicted in FIGS. 2 and 3A, a plurality of ports 216 are formed through an inside diameter wall 232 of the insert 246 that forms part of the inner wall 204 of the flow control ring 142. The inlet ports 216 fluidly couple the inlet plenum 210 to the internal volume 104 of the chamber 100. Thus, gases provided through the inlet port 134 formed in the lid 110 (shown in phantom in FIG. 2) may be delivered from the gas panel 136 to the interior volume 104 of the processing chamber 100 through the flow control ring 142.

The outlet plenum 212 is formed in the flow control ring 142 opposite the inlet plenum 210. One or more flow paths or upper outlet ports 118 are provided in the inner wall 204 of the flow control ring 142 to allow gases within the interior volume 104 of the processing chamber 100 to enter outlet plenum 212. The upper outlet port 118 may be any hole, slot, aperture or other flow conduit suitable for allowing flow to enter the flow control ring 142, and in the embodiment depicted in FIGS. 2 and 3A, the outlet port 118 is an annular notch formed in the inner wall 204 at the top 206 of the ring 142.

As shown in FIG. 2 by the flow arrows 180, the process gas entering the interior volume 104 through the inlet ports 216 of the flow control ring 142 are drawn back into the outlet plenum 214 of the flow control ring 142 through upper outlet port 218, thereby creating a cross-flow (e.g., flow from one edge to the edge on the opposing side of the substrate) of process gases laterally across the substrate 122 in a non-radial manner. The size, size variation, geometry and distribution of the inlet and upper outlet ports 216, 218 are selected to obtain desired gas flow distribution across the surface of the substrate.

Unused process gas and reaction by-products flow are routed from the outlet plenum 212 to the pumping plenum 214 through at least one transfer hole 220 formed through the internal wall 228. Again, the size, number of holes and geometry of the transfer hole(s) 220 allow the gas flow distribution to be tailored. In the embodiment depicted in FIGS. 2-3B, the transfer hole 220 is an annular slot.

A plurality of lower outlet ports 226 are formed through the inner wall 204 to allow purge gas (entering the chamber 100 below the pedestal 124, as shown in FIG. 1) to enter the pumping plenum 214. Gases entering the pumping plenum 214 through the lower outlet ports 226 and transfer hole 220 are drawn into the pumping channel 156 and exhausted from the chamber 100 by the pumping system 138. The size, size variation, geometry and distribution of the transfer holes 220 and the exhaust ports are selected to obtain desired gas flow into the pumping plenum 214, which assists in tuning the flow of process gases across the surface of the substrate and preventing process gases from contaminating the region below the pedestal 124.

Figure 4:
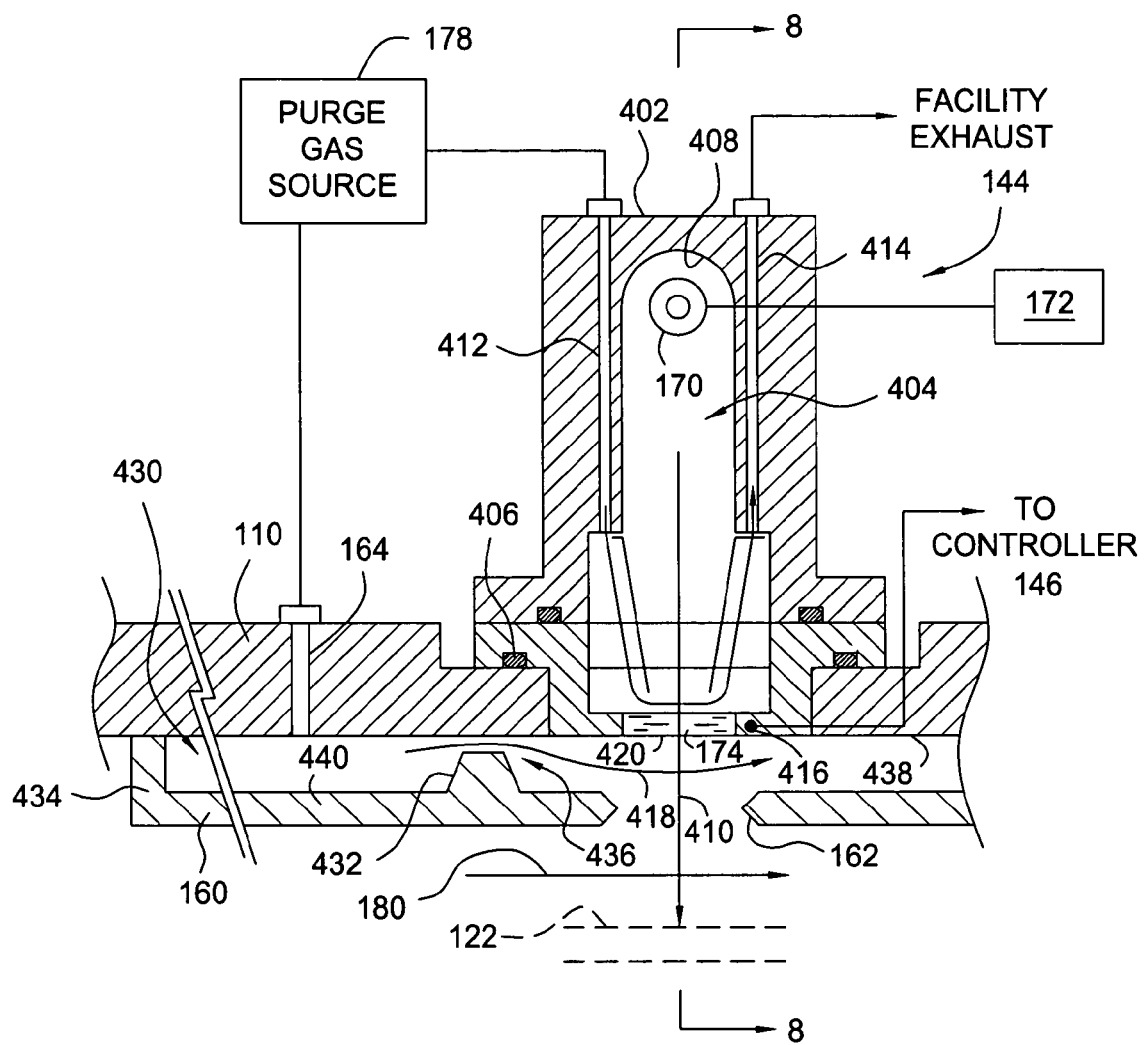
FIG. 4 is a partial sectional view of the lid of the chamber depicted in FIG. 1 and one embodiment of a photoexcitation system.

FIG. 4 is a sectional view of one embodiment of the direct photoexcitation system 192 mounted on the lid 100. The direct photoexcitation system 192 generally includes a housing 402 that retains the lamp 170 in an internal cavity 404 and a mounting frame 406 that secures a plurality of windows 174. The housing 402 may be fabricated from aluminum or other suitable material and is coupled to the lid 110 in a leak-tight manner. In one embodiment, the mounting frame 406 is sealed to the lid by a first o-ring, while the housing 402 is sealed to the mounting frame 406 by a second o-ring. It is contemplated that either o-ring may be replaced by a gasket or other sealing material. The mounting frame 406 and housing 402 may be secured to the lid by a fastener or other suitable method.

Interior walls 408 of the housing 402 defining the cavity 404 are coated with a reflective material to minimize parasitic absorption of energy generated by the lamp 174, thereby increasing the amount of energy directed through the window 170. In one embodiment, the reflective material coating the walls is nickel, although other reflective material may be used.

The walls 408 are shaped to enhance the direction of light or photons through the window 170. In one embodiment, an energy beam or flux 410 produced by the lamp 174 is directed substantially normal to the surface of the substrate 122 (shown in phantom). It is contemplated that it may be desirable to direct the beam or flux 410 at other angles of incidence to the substrate. For example, as illustrated in the schematic diagram of FIG. 5A, a reflector 510 positioned proximate the lamp 174 may be configured to direct the beam or flux 410 at an acute angle relative to the substrate 122. In another example depicted in FIG. 5B, optics 520, such as a collimator lens 522 and a prism 524, may be utilized to set the angle of incidence of the beam or flux 410. It is also contemplated that a microactuator may be coupled to the prism 524 to select the angle of incidence in a range of about 45 to 90 degrees, as shown by the dashed arrows. As additionally shown in FIG. 5A, a shutter 550 may be utilized to pulse or selectively allow the beam or flux 410 to enter the internal volume 104 of the chamber 100 when desired.

To prevent the direct photoexcitation system 192 from overheating and to maintain consistent performance, the direct photoexcitation system 192 may be temperature controlled. For example, the purge gas source 178 may be coupled to the cavity 404 of the housing 402 by an inlet passage 412. The inlet passage 412 injects a heat transfer fluid, such as nitrogen to remove heat generated by the lamp 170 from the housing 402. The heat transfer fluid is removed from the cavity 404 through an outlet passage 414.

A thermocouple 416 is positioned to provide the controller 146 with a metric indicative of the temperature of the heat transfer fluid, window, lamp or other portion of the direct photoexcitation system 192 so that the temperature of the lamp and/or seals of the direct photoexcitation system 192 may be maintained within operating temperature ranges. For example, utilizing temperature information provided by the thermocouple 416, at least one of the power provided to the lamp 170, the temperature and/or the flow rate of the heat transfer fluid circulated through the housing 402 may be adjusted to maintain the lamp 170 from overheating or exceeding the operational temperature of the window 174.

Figure 6:
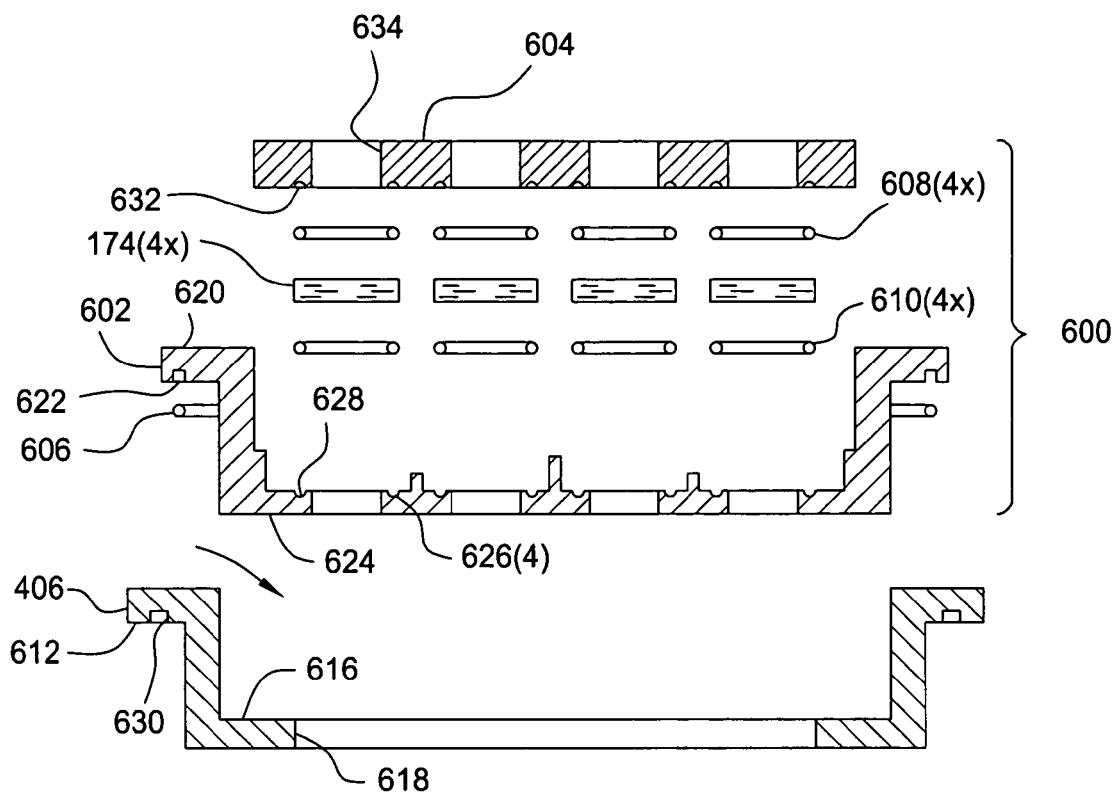
FIG. 6 is an exploded, sectional view of one embodiment of a frame assembly utilized to retain one or more windows in the photoexcitation system of FIG. 4.

FIG. 6 depicts an exploded view of one embodiment of a frame assembly 600 utilized to couple the windows 174 to the mounting frame 406. The mounting frame 406 includes a flange 612 having a gland 630 formed therein that accepts a seal utilized to provide the leak-tight seal between the mounting frame 406 and lid 110 as described above.

The frame assembly 600 generally includes a window insert mount 602 and a window frame 604. The window insert mount 602 is disposed in a pocket 614 framed in the mounting frame 406. The window insert mount 602 includes a flange 620 and a base 624. The flange 620 of the window insert mount 602 extends outward from the base 624 and includes a gland 622. A mount seal 606, such as an o-ring, is disposed in the gland 622 and provides a seal between the window insert mount 602 and a base 616 of the mounting frame 406. Compression of the mount seal 606 is maintained by fasteners (not shown) coupling the window insert mount 602 to the mounting frame 406.

The base 624 is generally an elongated rectangle that includes a plurality of apertures 626 for allowing passage of the energy beam or flux through the frame assembly. In the embodiment depicted in FIG. 6, the base 624 is disposed in a rectangular aperture 618 formed in the base 616 of the mounting frame 406.

One or more lamps 174 are secured between the window insert mount 602 and the window frame 604. In the embodiment depicted in FIG. 6, four windows 174 are clamped between the window insert mount 602 and the window frame 604. An upper window seal 608 is disposed in a gland 632 formed in the window frame 604 and provides a seal between the window 174 and the window frame 604. A lower window seal 610 is disposed in a gland 628 formed in the window insert mount 602 and provides a seal between the window 174 and the window insert mount 602. Compression of the upper and lower window seals 608, 610 is maintained by fasteners (not shown) coupling the window frame 604 to the window insert mount 602.

The seals between the window insert mount 602 and the mounting frame 406, and between the window 174 and window insert mount 602 and the mounting frame 406, are not required to be air-tight. Since the nitrogen-filled cavity 404 of the housing 402 is maintained at a higher pressure than the interior volume 104 of the processing chamber 100, slight leakage of nitrogen into the area of the chamber 100 between the baffle place 160 and the lid 110 is acceptable as being innocuous to processes performed in the chamber 100.

Once the windows 174 are clamped in place within the frame assembly 600, apertures 634 formed through the window frame 604 and apertures 624 formed through the window insert mount 602 align with the windows 174 and aperture 162 of the baffle plate 160 to allow the beam or flux of energy generated by the lamp 174 to enter the chamber.

To provide process control feedback, the direct photoexcitation system 192 may include one or more sensors that provide a metric indicative of lamp performance. This metric advantageously allows processors to selectively control process attributes to obtain films having desired properties and deposition rates.

Figure 8:
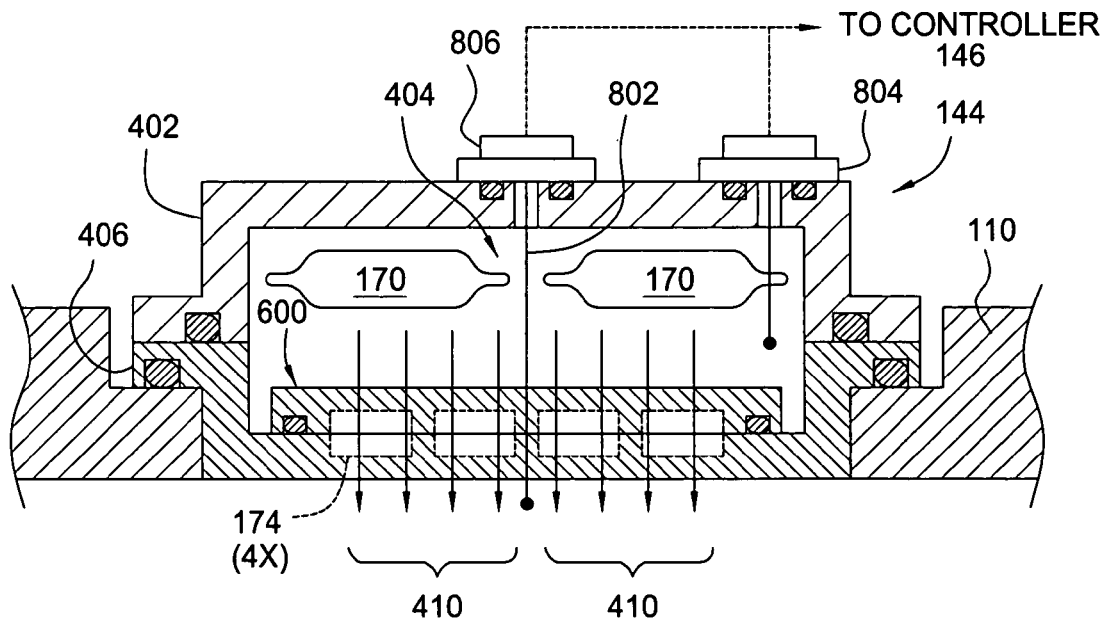
FIG. 8 is a sectional view of the lid and photoexcitation system taken along section lines 8-8 of FIG. 4.

FIG. 8 is a sectional view of the direct photoexcitation system 192 taken along section line 8-8 of FIG. 4 illustrating sensors utilized to provide metric indicative of lamp performance. In the embodiment depicted in FIG. 8, a first sensor 802 is disposed through the housing 402 and extends between the lamps 170, through the frame assembly 600 and into the interior volume 104 of the chamber 100. The sensor 802 may utilize a compression fitting 808 or suitable seal to prevent gas leakage from the housing 402. The first sensor 802 is generally capable of providing a metric indicative of the energy incident on the substrate 122. In one embodiment, the first sensor 802 is a flux sensor. One suitable flux sensor that may be adapted to benefit from the invention is available from Hamamatsu Corporation, located in Hamamatsu City, Japan. As the first sensor 802 is positioned below the window 174 and relatively close to the substrate 122, the energy levels measured are indicative of the actual energy reaching the substrate, and accounts for parasitic energy losses such as energy absorbed by the window 174 and gases within the housing 402 and processing chamber 100. Thus, if a predetermined energy level is desired at the substrate surface, the lamp 170 (or other processing attribute) may be adjusted in-situ to obtain and/or maintain a desired film characteristic.

A second sensor 804 may be utilized to detect energy levels in the housing 402. The second sensor 804 is sealed to the housing 402 as described above with reference to the first sensor 802. The second sensor 804 is generally capable of providing a metric indicative of the energy generated by the lamp 170 within the housing 402. In one embodiment, the second sensor 804 is a flux sensor. Information obtained from the first sensor 802 may be compared with the information obtained from the second sensor 804 to determine parasitic energy losses as the energy generated by the lamp acts upon objects, such as the window, gases and the substrate, positioned within the chamber. Through design experiments, for example by comparing data from the sensors with and without process gas flows, the energy incident on the substrate 122 and absorbed by the process gases may be determined and utilized to control film properties during deposition.

Returning to FIG. 4, a curtain 418 of inert gas is provided across a lower surface 420 of the window 174 to further maintain the performance of the direct photoexcitation system 192. The curtain 418 is created by flowing nitrogen (or other inert gas) into a purge plenum 430 defined between a body 440 of the purge plate 160 and the lid 110.

Figure 7A:
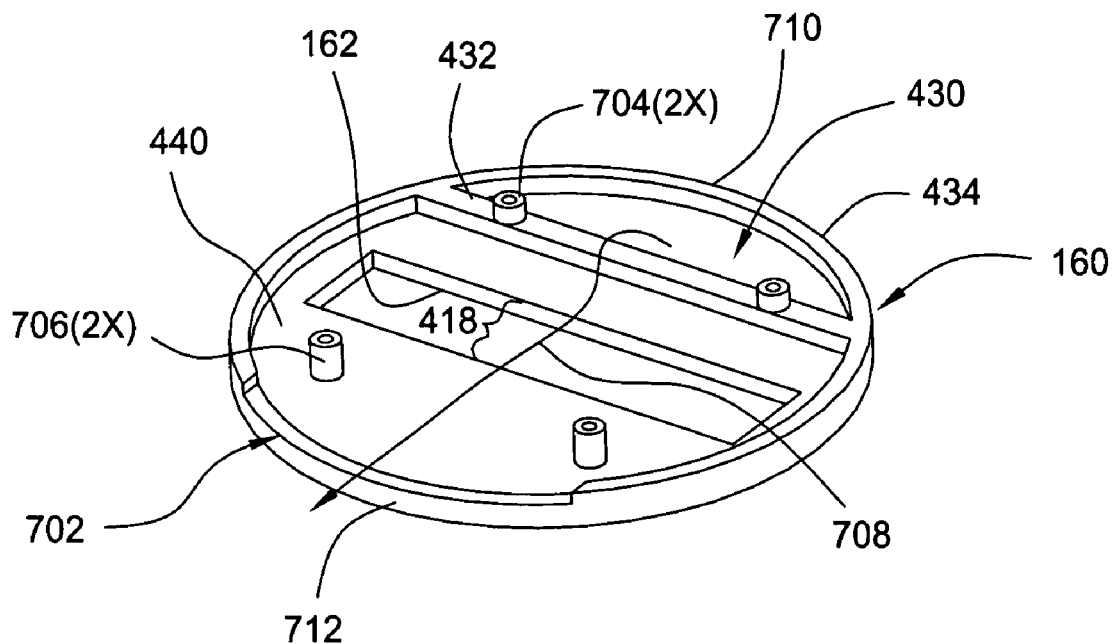
FIGS. 7A-B are top and bottom perspective views of a baffle plate.
Figure 7B:
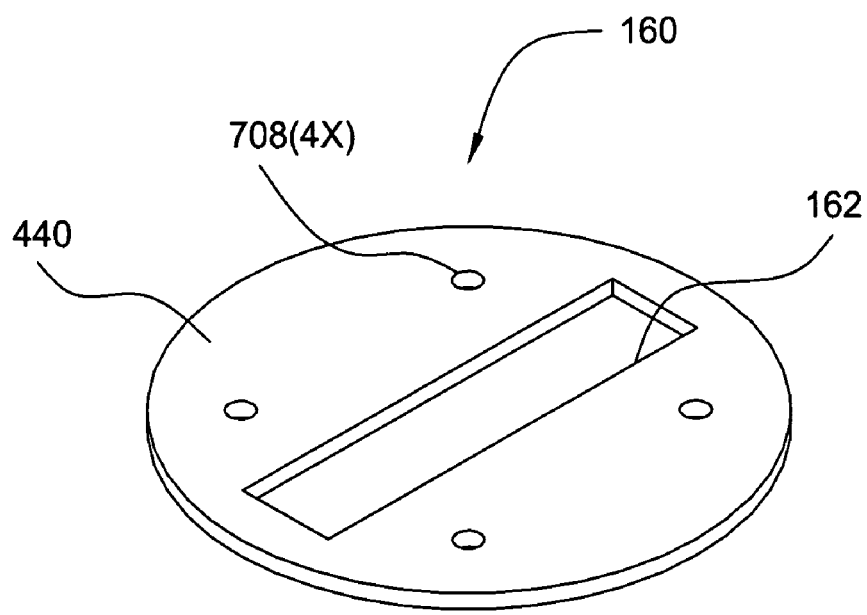

Referring additionally to the top and bottom perspective views of the purge plate 160 depicted in FIGS. 7A-B, the purge plenum 430 is bounded by a lip 434 extending from the body 440 to the lid 110 and a weir 432. The body 430 provides a physical separation between the lid 110 and the process gases flowing into the chamber 100. The body 430 typically has no openings or apertures between a first side 710 of the body 440 disposed over the inlet ports 216 and the aperture 162 to prevent process gases from contacting the window 174.

The lip 434 extends further from the body 440 than the weir 432. Thus, gases flowed into the purge plenum 430 are substantially confined in the purge plenum 430 and forced over an orifice 436 defined between the weir 432 and the lid 110, as represented by arrow 708. The lip 434 includes a release port 702 formed on a second side 712 of the baffle plate 160 opposite the first side 710 that allows the purge gases to escape from behind the baffle plate 160 and enter the flow control ring 142 through the outlet plenum. In the embodiment depicted in FIG. 7A, the release port 702 is a notch formed in the distal end of the lip 434.

The orifice 436 (and weir 432 that defines the orifice 436) extends parallel to and spaced apart from the window 174. The pressure drop across the orifice 436, along with the pressure within the interior volume and purge plenum 430, are selected to control the flow of the curtain 418 in the direction substantially parallel to the process gas flow depicted by arrows 180 while maintaining substantially uniform flow across the weir 432 so that the window 174 is protected by the curtain 418. In one embodiment, the velocity of the curtain 418 is substantially matched to the process gas flow to minimize turbulent mixing of the gases that may bring some process gases in contact with the window 174.

To ensure uniform spacing between the baffle plate 160 and the lid 110, a plurality of stand-offs or bosses 704, 706 extend from the baffle plate 160. The first set of bosses 704 extend from the weir 432, while the second set of bosses 706 extend from the body 440 between the region of the body 440 defined between the aperture 162 and the second side 712. The bosses 704 additionally provide a structure through which a passage 708 is formed. The passage 708 extends through the baffle plate 160 and accommodates fasteners (not shown) utilized to secure the baffle plate 160 to the lid 110. In the embodiment depicted in FIG. 7B, each passage 708 through the bosses 704, 706 is counter-bored or counter-sunk on the pedestal side of the baffle plate 160 to recess the head of the fastener.

Returning to FIG. 1, the remote photoexcitation system 182 may be disposed between the gas panel 136 and the inlet port 134. The remote photoexcitation system 182 may be utilized to energize the gases entering the chamber 100 from the gas panel 136. The energized gases may be utilized for treating the substrate, cleaning the chamber, promoting a film deposition and/or controlling characteristics of the deposited film.

In one embodiment, the remote photoexcitation system 182 includes a lamp 184 disposed in a housing 194. The lamp 184 is coupled to the power source 172, or other suitable source. The lamp 184 generally produces energy in a range of between about 1 and about 10 eV, and at a frequency between about 100 to about 480 nm. In one embodiment, the lamp 184 is an excimer lamp.

In another embodiment, the lamp 184 may include one or more lamps that generate energy at different wavelengths. Thus, different lamps may be energized at different times during a process to produce a desired energy level. Thus, one lamp may be utilized to energize a selected gas and/or surface while another lamp may be utilized to energize a different gas and/or achieve a desired effect on the deposited film.

In another example, a first wavelength may be utilized to energize a first precursor or a surface, followed by a second wavelength utilized to energize a second precursor or the surface. In such a manner, monolayer deposition may be achieved. Other examples suitable for monolayer deposition through atomic and/or cyclic deposition techniques includes, but is not limited to, photoenergization of only one of the two precursors, photoenergization of a purge gas flowed into the chamber between injection of at least one of or after both of the precursors, photoenergization of the substrate surface between injection of at least one of or after both of the precursors, and combinations thereof among others process sequences.

Gas from the gas panel 136 flowing through a passage 188 formed in the housing 194 may optionally be separated from the lamp 184 by a window 186. The window 186 may be fabricated from a suitable transmissive material, such as magnesium fluoride.

A remote plasma source (RPS) 190 may be coupled to the processing chamber 100. The RPS 190 generally provides a reactive cleaning agent, such as disassociated fluorine, that removes deposition and other process byproducts from the chamber components. In the embodiment depicted in FIG. 1, the RPS 190 is coupled to the inlet port 134 such that the inlet side of the flow control ring 142 is cleaned. Optionally, RPS 190 may be coupled to the purge gas inlet 164 so that the cleaning agent may more effectively clean the window 174.

Alternatively, fluorine or other suitable cleaning agent may be provided to the purge gas inlet 164 from the gas panel 136 to clean the window 174. The cleaning agent, whether provided from the RPS 190 or the gas panel 136, may be energized by the lamp 170 to increase the energy state of the gases proximate the window 174. It is also contemplated that a cleaning agent may be energized by the remote photoexcitation system 182 and delivered into the chamber 100 through the inlet port 134.

The controller 146 is coupled to the various components of the processing chamber 100 to facilitate control of a silicon nitride deposition process as described below. The controller 146 generally includes a central processing unit (CPU) 150, a memory 148, and support circuits 152. The CPU 150 may be one of any form of computer processor that can be used in an industrial setting for controlling various chambers and sub processors. The memory 148, or computer readable medium, may be one or more of readily available memory, such as random access memories (RAM), read-only memory (ROM), floppy disk, hard drive, flash memory, or any other form of digital storage, local or remote. The support circuits 152 are coupled to the CPU 150 for supporting the processor in a conventional manner. These support circuits 152 include cache, power supplies, clock circuits, input/output circuitry and subsystems, and the like. A process, for example, one of the silicon-containing material deposition processes 900A-B described below, is generally stored in the memory 148, typically as a software routine. The software routine may also be stored and/or executed by a second CPU (not shown) that is remotely located from the hardware being controlled by the CPU 150. Although the deposition process of the present invention is described as being implemented as a software routine, some of the method steps that are disclosed therein may be performed in hardware as well as by the software controller. As such, the invention may be implemented in software as executed upon a system computer, in hardware as an application specific integrated circuit or other type of hardware implementation, or a combination of software and hardware.

Figure 9A:
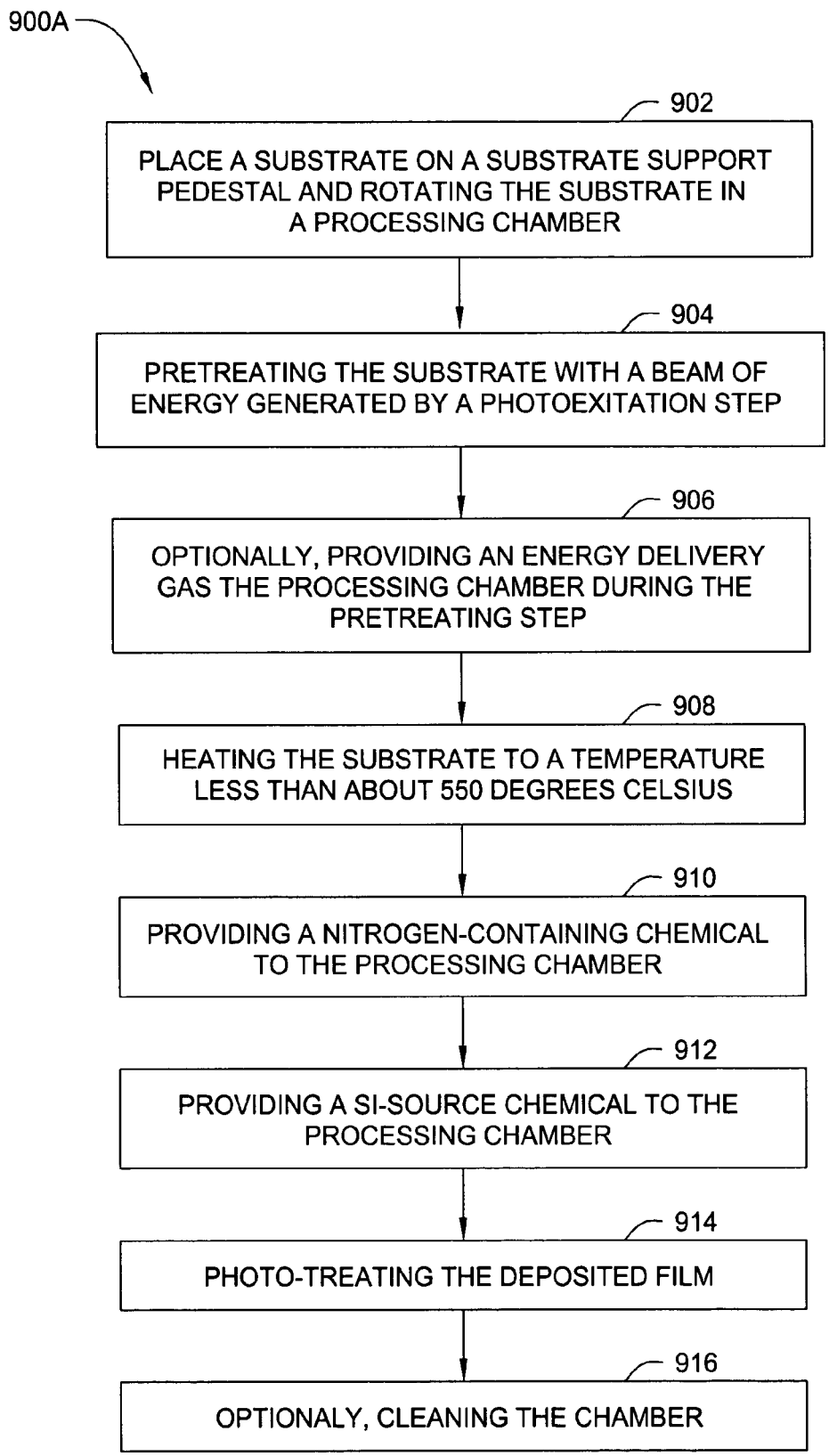
FIG. 9A-B are flow diagrams of various embodiment of a method of depositing a silicon nitride film.
Figure 9B:
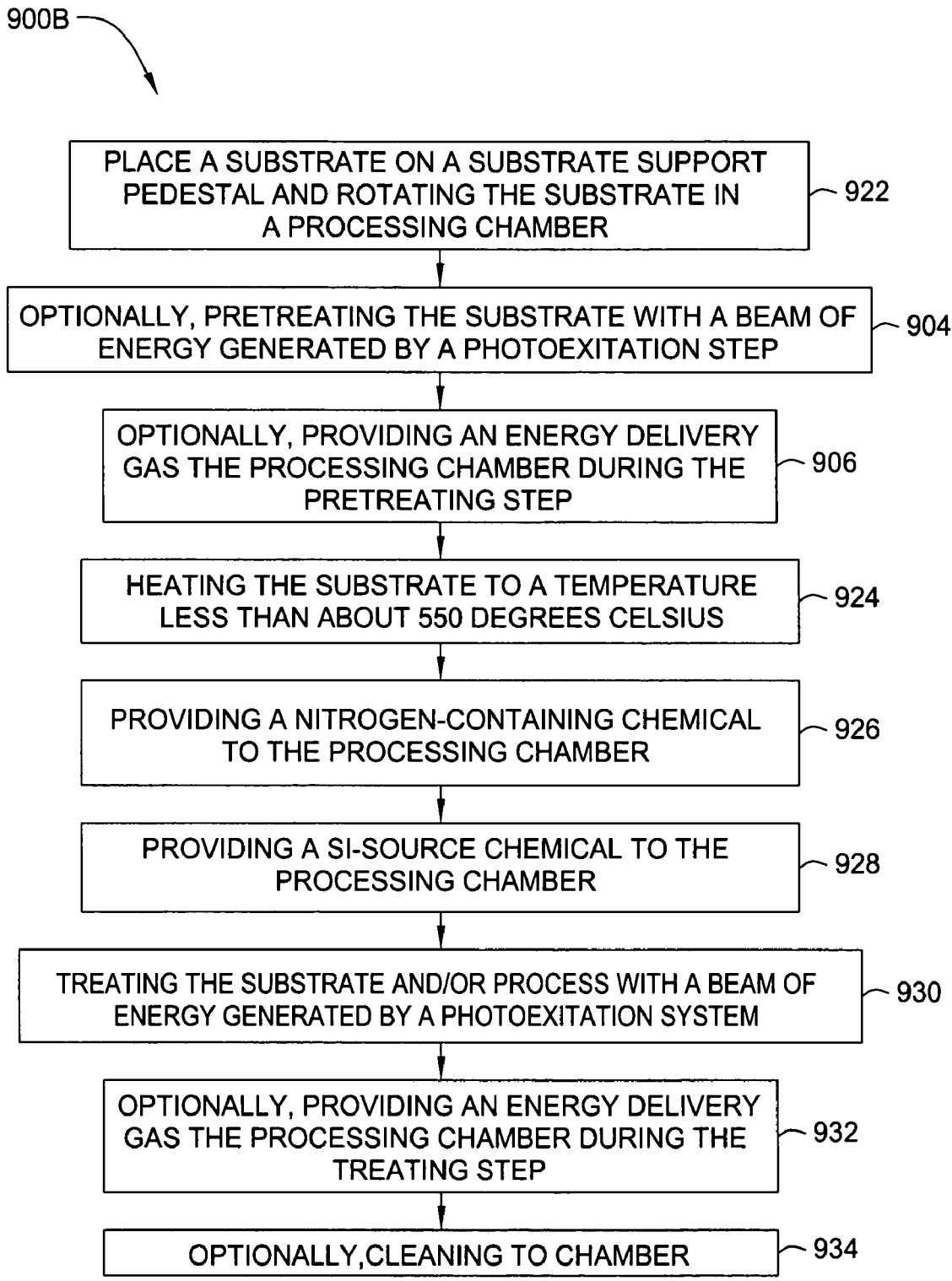

FIGS. 9A-B are flow diagrams of various embodiments of a silicon-containing material deposition process, which may be performed in the processing chamber 100, or other suitable equipment. As stated above, although these exemplary embodiments are described for fabricating a silicon-containing material, such as silicon nitride, the method and apparatus is suitable for depositing other materials.

In the embodiment depicted in FIG. 9A, a method 900A for depositing silicon-containing material begins at step 902 by placing the substrate 122 on the substrate support pedestal 124 and rotating the substrate. In one embodiment, the substrate 122 is rotated between about 0 to about 120 revolutions per minute. Optionally, the substrate 122 may be indexed during one or more steps of the process 900.

The substrate 122 on which embodiments of the silicon nitride deposition process of the invention may be practiced include, but are not limited to semiconductor wafers, such as crystalline silicon (e.g., Si<100> or Si<111>), silicon oxide, strained silicon, SOI, silicon germanium, and doped or undoped polysilicon. The substrate surface on which the silicon-containing layer is deposited may be bare silicon, a dielectric material, a conductive material, a barrier material, and the like. Optionally, the substrate 122 may be pretreated prior to the deposition of the silicon-containing material by polishing, etching, reduction, oxidation, halogenation, hydroxylation, annealing and/or baking.

At step 904, the substrate 122 is pretreated with a beam of energy generated by the direct photoexcitation system 192 to remove native oxides on the surface of the substrate 122 prior to deposition. In one embodiment, the lamp 170 provides a beam of energy in the range of between about 2 to about 10 eV. In another embodiment, the lamp 170 provides a beam of energy has a wavelength in the range of between about 351 to about 126 nm. The lamp 170 is energized for a period sufficient to remove oxides. The energization period is selected based upon the size and geometry of the window 174 (which corresponds to the exposed area of the substrate) and the substrate rotation speed. In one embodiment, the lamp 170 is energized for a period of about to about 2 to 10 minutes to facilitate native oxide removal by photoexcitation. Substrate temperature during step 904 may be maintained between 100 to 800 degrees Celsius. In another embodiment, substrate temperature during step 904 may be maintained between about 300-500 degrees Celsius while the lamp 170 provides a beam of energy in the range of between about 2 to about 10 eV for a period of about to about 2 to 5 minutes to facilitate native oxide removal.

Native oxide removal may be augmented by photoexcitation in the presence of other gases. For example, polycyclic aromatic hydrocarbons, such as anthracene, napthalene, phenanthracene, and others, may be introduced into the chamber in the presence of UV radiation generated by the lamp 170 in the range of between about 351 to about 126 nm to remove native oxides by forming the respective 9,10 quinone and 9,10 hydroxyquinone derivatives whose vapor will be pumped it out. In presence of UV radiation, quinone and hydroxyquinone derivatives form easily.

Optionally, at step 906, an energy delivery gas may be provided to the interior volume 104 of the chamber 100 during the photoexicitation step 904. The energy delivery gas may be provided through the flow control ring 142 from the gas panel 138. Examples of suitable energy delivery gases include, but are not limited to, Ne, Ar, Kr, Xe, ArBr, ArCl, KBr, KCl, KrF, $XeF_2$, $XeCl_2$, $XeBr_2$, among others. The proximately of energy delivery gas to the lamp 170 compared to the substrate 122 allows the energy delivery gas to be readily excited. As the energy delivery gas de-excites and move closer to the substrate 122, the energy is efficiently transferred to the surface of the substrate, thereby facilitating the removal of native oxides.

At step 908, the substrate 122 is heated. In one embodiment, the substrate 122 is heated to a temperature less than about 550 degrees Celsius. Optionally, the substrate 122 may be heated to a temperature above 550 degrees Celsius up to a limit of about 800 degrees Celsius, depending on fabrication requirements. In one embodiment, the substrate 122 is heated by applying power from the power source 116 to the resistive heating element (i.e., the heater 120) to heat the substrate 122 to a temperature between about 300 and about 500 degrees Celsius, and in yet another embodiment, the substrate 122 is heated to less than about 450 degrees Celsius.

At step 910, a nitrogen-containing chemical is provided to the interior volume of the processing chamber 100. The nitrogen-containing chemical is generally provided from the gas panel 136 to the inlet 104. The nitrogen-containing chemicals may be in liquid and/or gaseous form.

Examples of suitable nitrogen-containing chemicals include, but are not limited to, ammonia ($NH_3$), hydrazine $N_2H_4$), hydrogen azide $HN_3$, and combinations thereof. The nitrogen-containing chemicals ideally contain a nitrogen-nitrogen single bond (i.e., N—N single bond) for decomposition of the nitrogen-containing chemical at low temperatures. Additionally, when a Si-containing chemical and nitrogen-containing chemical are used in the process gas mix, some amount of a nitrogen-containing chemical may be included in the gas mix for additional control over the composition of the deposited layer during deposition. In one embodiment, the nitrogen-containing chemical is $NH_3$.

In another embodiment, the nitrogen-containing chemical has the general chemical formula of $R(C)—C_xN_yR(N)$, where R(C) is hydrogen or other hydrocarbon compound group, R(N) is nitrogen or other nitrogen containing compound group, and x and y are positive integers. Examples of suitable nitrogen and carbon containing gases include, but are not limited to, $(CH_3)_3$—N, $H_3C$—$NH_2$, methylamine, $H_3C$—NH—$NH_2$, methylhydrazine, $(H_3C)$—N=N—H, and HC≡N, among others.

The nitrogen-containing chemical may alternatively be characterized as a carbon, nitrogen and hydrogen containing compound that can be disassociated below 500 degrees Celsius with a high vapor pressure at room temperature. Other examples of suitable nitrogen-containing chemicals include, but are not limited to, $CH_5N$ (vapor pressure of about 353 kPa at 25 degrees Celsius), methyl-hydraine ($CH_6N_2$, vapor pressure of about 66 kPa at 25 degrees Celsius), and hydrocyanic acid (CHN; vapor pressure of about 98.8 kPa at 25 degrees Celsius), among others.

At step 912, a flow of Si-source chemical having at least one Si—N bond is provided to the interior volume 104 of the chamber body 102 through the flow control ring 142 from the gas panel 136. The Si-source chemical may be in liquid and/or gaseous form.

It is contemplated that the nitrogen-containing chemical in step 206 together with Si-containing chemicals in step 208 can be introduced to inlet port 134 simultaneously, or that step 206 may proceed or follow step 208. Furthermore, step 206 and step 208 can be programmed in such way the chemical dosing time can be designed to ensure atomic layer coverage and enough purge between each step with desirable inert gases such as argon.

Si-containing chemicals that can be used to produce a silicon nitride layer by thermal chemical vapor deposition at sufficiently high deposition rates while at a low temperatures include compounds having one or more Si—N bonds or Si—Cl bonds, such as bis-tertbutylaminosilane (BTBAS) or hexachlorodisilane (HCD or $Si_2Cl_6$). Further inclusion of Si—Si bonds, N—N bonds, N=N bonds, a mixture of Si—N and Si—Cl bonds, or combinations thereof, in the precursor is may be beneficial in certain embodiments.

Combination of a Si—Cl functional group (bond) and a Si—N functional group (bond) has been observed to improved step coverage and microloading especially for the ever decreasing temperatures at suitable deposition rates. The number of Si—Cl groups can be varied relative to the number of Si—N groups.

Compounds having preferred bond structures described above have the generic structures:

(I) $NR_2$—$Si(R'_2)$—$Si(R'_2)$—$NR_2$, (amino(di)silanes),
(II) $R_3$—Si—N=N=N, (silyl azides), or
(III) $R'_3$—Si—NR—$NR_2$ (silyl hydrazines).

In the above generic structures, R and R' comprise one or more functional groups selected from the group of a halogen, an organic group having one or more double bonds, an organic group having one or more triple bonds, an aliphatic alkyl group, a cyclical alkyl group, an aromatic group, an organosilicon group, an alkyamino group, or a cyclic group containing N or Si, and combinations thereof.

Examples of suitable functional groups include chloro ($Cl^-$), methyl (—$CH_3$), ethyl (—$CH_2CH_3$), isopropyl, trimethylsilyl, pyrrolidine, and combinations thereof. Examples of suitable compounds include:

1,2-diethyl-tetrakis(diethylamino)disilane; $(CH_2CH_3(NCH_2CH_3)_2Si)_2$
1,2-dichloro-tetrakis(diethylamino)disilane; $(Cl(NCH_2CH_3)_2Si)_2$
hexakis(N-pyrrolidinio)disilane; $((C_4H_9N)_3)Si)_2$
1,1,2,2-tetrachloro-bis(di-trimethylamino)disilane; $(Cl_2(NSi(CH_3)_3))Si)_2$
1,1,2,2-tetrachloro-bis(di-isopropyl)disilane; $(Cl_2(N(C_3H_7)_2))Si)_2$
1,2-dimethyl-tetrakis(diethylamino)disilane; $(CH_3(NCH_2CH_3)_2Si)_2$
tris(dimethylamino)silane azide; $(N(CH_3)_2)SiN_3$
trimethylamino silane azide; $(CH_3)SiN_3$
(2,2 dimethylhydrazine)dimethylsilane $(CH_3)_2SiH$—NH—$N(CH_3)_2$,
and combinations thereof.

It is believed that silicon-containing chemical (precursor) or the nitrogen-containing chemical (precursor) listed in the discussion above enables the molecule to decompose or disassociate at reduced temperatures, such as about 550° C. or less.

Other examples of suitable Si-containing chemicals include silyl azides $R_3$—$SiN_3$ and silyl hydrazine class of precursors $R_3SiNR$—$NR_2$, linear and cyclic with any combination of R groups. The R groups may be H or any organic functional group such as methyl, ethyl, propyl, butyl, and the like ($C_xH_y$). The R groups attached to Si can optionally be another amino group $NH_2$ or $NR_2$. One benefit of using this Si-containing chemical gas is that silicon and nitrogen are simultaneously delivered while avoiding the presence of chlorine to yield films with good step coverage and minimal pattern dependence (so-called pattern loading) without the undesirable ammonium chloride particle formation problematic to other conventions Si—N film precursors.

It is noted that an N—N bond also exists in hydrogen azide, hydrazine, and methyl hydrazine, and CVD deposition of SiN-containing films performed. However, addition of a separate Si-source is required for these latter precursors, and low temperature silicon sources such as disilane show poor step coverage and high pattern loading while hexachlorodisilane (HCD) is plagued with ammonium chloride particle issues. Noting that aminosilanes, such as BTBAS, show minimal pattern loading and good step coverage with no ammonium chloride concerns, the delivery of the intact Si—N unit appears to be a requisite. However, aminosilanes generally require processing temperatures well in excess of 600 degrees Celsius to have acceptable deposition rates. The solution to meet all the requirements is to utilize a precursor that contains both of the critical features—the weak N—N bond and the aminosilane functionality Si—N—for low temperature decomposition.

Examples of specific silyl azides include trimethylsilylazide (available commercially from United Chemical Technologies, located in Bristol, Pa.) and tris-dimethylamino-silyl azide. Examples of specific silylhydrazines include $(CH_3)_2HSiNH$—$N)CH_3)_2$.

In the embodiment wherein the nitrogen-containing chemical has the general chemical formula of $R(C)$—$C_xN_yR(N)$, the Si-source chemical may be at least one of $(SiR_3)_3$—N, $(SiR_3)_2N$—$N(SiR_3)_2$ and $(SiR_3)N$=$(SiR_3)N$, wherein R is hydrogen (H), or a hydrocarbon reagent or a fragment consisting of methyl, ethyl, phenyl, tertiary, butyl and their combinations. In one embodiment, R is free of halogens and contains hydrogen. In another embodiment, R includes one or more halogens elements and contains hydrogen. Examples of suitable Si-source gases include $(SiH_3)_3$—N, $(SiH_3)_2N$—N $(SiH_3)_2$, $(SiH_3)N$=$(SiH_3)N$ and trisilylamine, among others.

Although one gas line 140 is shown disposed between the gas panel 136 and the inlet port 134, it is contemplated that the Si-containing chemical and the nitrogen-containing chemical are provided to the processing chamber 100 in separate gas lines. It is also contemplated that the gas lines may be temperature controlled. It is further also contemplated that nitrogen-containing chemicals in step 910 together with Si-containing chemicals in step 912 can be introduced to inlet port 134 simultaneously, or sequentially. As such, either step 910 may occur before step 912, or step 910 may occur after step 912. Furthermore, steps 910, 912 may be executed to selectively control the chemical dosing time to ensure atomic layer coverage, and to allow purging between each step with desirable inert gases, such as argon.

As the Si-source chemical and the nitrogen-containing chemical are combined in the substrate processing chamber 100, a silicon-containing material, such as a silicon nitride ($Si_3N_4$) film, is formed on the heated substrate 122. The deposited silicon-containing material exhibits good film qualities such as reflective index and wet etch rate, and deposition rates greater than 5 Å/min. In one embodiment, the silicon-containing film is deposited at a rate from about 10 Å/min to about 500 Å/min and is deposited to a thickness from about 10 Å to about 1,000 Å. The silicon-containing film formed as described above exhibits low hydrogen content and includes a small amount of carbon doping, which enhances boron retention in PMOS devices. In embodiments where a halogen-free Si-source chemical is utilized, improved wet etch rate may be realized.

A carrier gas may be provided at step 910 and/or step 912 to control the partial pressure of the nitrogen-containing chemical and/or the Si-source chemical from a few mTorr to a few hundred Torr, and to control the total process pressure from about 100 mTorr to about 740 Torr in single wafer chambers. In another embodiment, the pressure within the processing chamber is maintained between about 10 to 740 Torr. The carrier gas may be provided to control the partial pressure of the nitrogen-containing chemical and/or the Si-source chemical from about 100 mTorr to 1 Torr in batch processing systems. Examples of suitable carrier gases include $N_2$, Ar and He, among others.

Optionally, an oxygen precursor may be added to the deposition method 900A, typically at step 910 and/or step 912, to form silicon oxide or silicon oxynitride. Oxygen precursors that may be used in the deposition processes described herein include atomic oxygen, oxygen ($O_2$), ozone ($O_3$), $H_2O$, $H_2O_2$, organic peroxides, alcohols, $N_2O$, NO, $NO_2$, $N_2O_5$, derivatives thereof and combinations thereof.

At step 914, the deposited film is treated using energy provided by the photoexcitation system 144. This post deposition treatment step 914 is similar to and may be performed as described for a treatment step 930, detailed below.

At step 916, the processing chamber is cleaned after the substrate is removed. The processing chamber may be cleaned using a photoexcited cleaning agent. Alternatively, the cleaning agent may be provided from the remote plasma source 190. In one embodiment, the cleaning agent includes fluorine.

The cleaning agent may be photoexcited in the processing chamber using the lamp 170, or remote from the chamber using the lamp 184. It is contemplated that the lamp 170 may be used to maintain the excitation level of cleaning agents provided from the remote plasma source 190.

Cleaning the processing chamber 100 periodically during processing enhances deposition performance. For example, the cleaning process removes contaminants from the windows 174, 186, thereby minimizing transmission losses of the energy beam or flux traveling through the window and maximizing the energy transferred to the gases and surfaces. It is also contemplated that the windows 174, 184 may be cleaned using a photoexcited agent, while chamber cleaning is performed using the remote plasma source. The windows 174, 184 may be cleaned with greater frequency than the chamber, for example, the chamber may be cleaned using the remote plasma source after processing a number of substrates while the windows 174, 184 are cleaned after processing each substrate.

In the embodiment depicted in FIG. 9B, a method 900B for depositing silicon-containing material begins at step 922 by placing the substrate 122 on the substrate support pedestal 124 and rotating the substrate similar to step 902 above. Optionally, a pretreatment such as step 904 (and, additionally step 906) described above may be performed. At step 924, the substrate 122 is heated. On one embodiment, the substrate 122 is heated to a temperature less than about 550 degrees Celsius. Optionally, the substrate 122 may be heated to a temperature above 550 degrees Celsius up to a limit of about 800 degrees Celsius, depending on fabrication requirements. In one embodiment, the substrate 122 is heated by applying power from the power source 116 to the resistive heating element (i.e., the heater 120) to heat the substrate 122 to a temperature between about 300 and about 500 degrees Celsius, and in yet another embodiment, the substrate 122 is heated to less than about 450 degrees Celsius. It is to be noted that the substrate support set point temperature will be impacted by the photon beam/flux energy and, depending on the energy delivered to the substrate from the photoexcitation source, the substrate support temperature may have to be adjusted to maintain a specific target value.

At step 926, a nitrogen-containing chemical is provided to the interior volume of the processing chamber 100 similar to step 910 described above. At step 928, a flow of Si-containing chemical having at least one Si—N bond is provided to the interior volume 104 of the chamber body 102 through the flow control ring 142 from the gas panel 136 similar to step 912 described above. As in the embodiment described in 900A above, carrier gas or optional oxygen precursor may be utilized at step 926 and/or step 928.

At step 930, the substrate 122 is treated with a beam or flux of energy generated by the photoexcitation system 144. The treatment step may occur during at least one of steps 926 and 228, and may occur as a post deposition treatment step.

In one embodiment of the photoexcitation step 930, the lamp 170 of the direct photoexcitation system 192 provides a beam of energy to increase the surface energy of the substrate during deposition, which advantageously increases the deposition rate, creates and conserves the silicon dangling board and improves surface diffusion or mobility of atoms within the film to create active sites for incoming reactive species. In this embodiment, the beam of energy is applied in the range of between about 3.0 to about 9.84 eV. In another embodiment, the lamp 170 provides a beam of energy has a wavelength in the range of between about 450 to about 126 nm.

In another embodiment of the photoexcitation step 930, the lamp 170 of the direct photoexcitation system 192 and/or the lamp 184 of the remote photoexcitation system 182 provides a beam of energy to increase the excitation energy of at least one of the Si-containing chemical and/or the N-containing chemical, which advantageously increases the deposition rate without increasing the overall deposition temperature. The high rate, low temperature deposition reaction produces a film having tunable properties with minimal parasitic side reactions. In this embodiment, the beam or flux of energy is applied in the range of between about 4.5 to about 9.84 eV. The surface of the substrate may also be excited by the lamp in addition to the process gases being energized.

Gas phase excitation and surface reactions will be controlled by UV excimer selection. For example, optical excitation of $Si_2H_6$ may be achieved using UV photons of hv>4.5 eV and hv>8 eV ($\lambda$<155 nm), respectively. Accordingly, intermediates of silanes—and $NH_3$* (405 nm), $NH_2$* (470.7 nm), NH* (336 nm) (with * indicating the compound in an excited state) enhances cross-linking between Si and N which is believed to cause Si—N bond distortion in the SiN network, desirable for increasing film tensile stress.

In yet another embodiment of the photoexcitation step 930, the lamp 170 provides a beam of energy to increase the surface energy of the substrate after deposition, which advantageously removes volatiles and/or other film contaminates (such as by reducing the hydrogen content) and/or to anneal the deposited film. The removal of hydrogen from Si and/or N from within the film advantageously increases film tensile stress. The lamp 184 may alternatively be utilized to energize an energy delivery gas which is bought in contact with the substrate to increase the surface energy of the substrate after deposition and remove volatiles and/or other films.

In one embodiment practiced for removing volatiles from the deposited film surface, UV radiation in the range of 3.2 eV to 4.5 eV is generated by the lamp 170 and/or lamp 184 is utilized to dissociate Si—H (3.21 eV), N—H (3.69 eV), NH—H (3.86 eV), H2N—H (4.47 eV), and Si—N (4.51 eV) radicals within the processing chamber 100. Thus, excimer lamps, such as XeBr* (283 nm/4.41 eV), Br$_2$* (289 nm/4.29 eV), XeCl* (308 nm/4.03 eV), I$_2$* (342 nm/3.63 eV), XeF* (351 nm/3.53 eV) may be selected to dissociate the Si—H and N—H bonds to remove hydrogen from the SiN network. It is contemplated that the rotational speed of the substrate may be changed, for example, by increasing the rotation speed in step 930 relative to the preceding steps in which deposition occurs.

In another embodiment for annealing deposited films, the beam or flux of energy is applied in the range of between about 3.53 to about 9.84 eV. In another embodiment, the lamp 170 provides a beam of energy has a wavelength in the range of between about 351 to about 126 nm. Generally, the lamp 170 is energized for about 1 to about 10 minutes to facilitate post deposition treatment by photoexcitation.

Optionally, at step 932, an energy delivery gas may be provided to the interior volume 104 of the chamber 100 during the photoexcitation step 930. Examples of suitable energy delivery gases include, but are not limited to, nitrogen, hydrogen, helium, argon, and mixtures thereof, among others. In anther example, the energy delivery gas and/or the atmosphere within the chamber during the photoexcitation step does not include oxygen. In another embodiment, the energy delivery gas and/or the atmosphere within the chamber during the photoexcitation step includes oxygen and/or ozone.

The method 900B may also include a chamber cleaning step 934. The cleaning step 934 is generally as described above with reference to the cleaning step 916.

The methods 900A-B allows tuning of the deposited film, particularly the ability to manage and control the Si/N/C/H content of the films. By controlling the relative Si, N, C and H content of the film, film properties such as wet etch rate, dry etch rate, stress, dielectric constant, and the like may be tailored for specific applications. For example, by reducing the hydrogen content, the film may be deposited with higher tensile stress.

Additionally, when using N—Si—R or N—Si—Si—R type of precursors, the dissociation of the Si-source molecule takes place at lower temperatures, thereby enabling lower temperature processing. The reason for this is that the functional group (Si—R or Si—Si) is weakly bonded compared to Si—N bond. Furthermore, the nitrogen-containing chemicals used in this invention that contain a carbon and hydrogen function group, which react with R or Si—R from N—Si—R or N—Si—Si—R in the Si-containing chemical, allow the R group to become dissociated and more easily removed than without reacting with nitrogen-source chemical. Thus, the nitrogen-source chemical functions as catalyst in this process in addition to providing additional nitrogen and carbon source to the final film. Thus, embodiments of the methods described above advantageously facilitates low temperature processing, e.g., at temperatures less than about 550 degrees Celsius.

Silicon-containing materials deposited utilizing the methods 900A-B described above are used throughout electronic features/devices due to several physical properties. Silicon-nitrogen-containing materials, such as silicon nitride, are electric insulators, as well as barrier materials. The barrier properties inhibit ion diffusion between dissimilar materials or elements when silicon-nitride-containing material is placed therebetween, such as a gate material and an electrode, or between low dielectric constant porous materials and copper. Therefore, silicon-nitride-containing materials may be used in barrier layers, protective layers, off-set layers, spacer layers and capping layers. Another physical property of silicon nitride materials is a high degree of hardness. In some applications, silicon-containing materials may be used as a protective coating for various optical devices as well as tools. Another physical property of silicon-nitride-containing material such as silicon nitride is etch selectivity to silicon oxide, i.e., silicon nitride can be used as etch stop layer under a silicon oxide dielectric layer to accurately control etch depth without over etching or under etching. Yet another physical property of silicon-nitrogen-containing materials is that the carbon and hydrogen concentration can be used to tune film stress, such as high tensile stress which is desirable in selected applications.

Figure 10A:
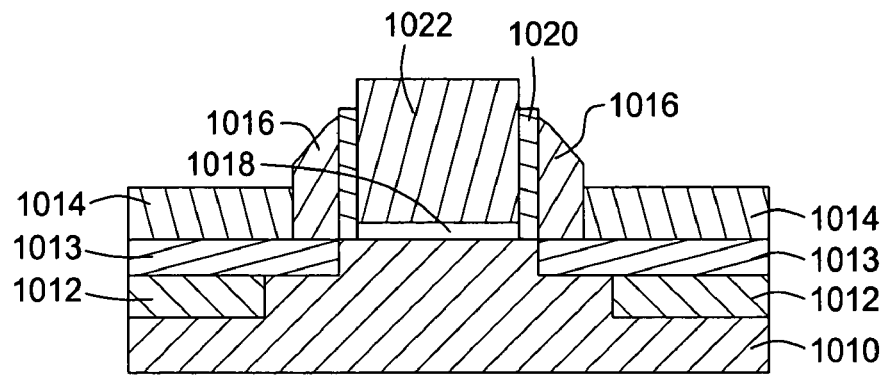
FIGS. 10A-B are cross sectional views of a MOSFET transistor having a silicon nitride layer at least partially deposited according to either the methods of FIG. 9A or 9B.
Figure 10B:
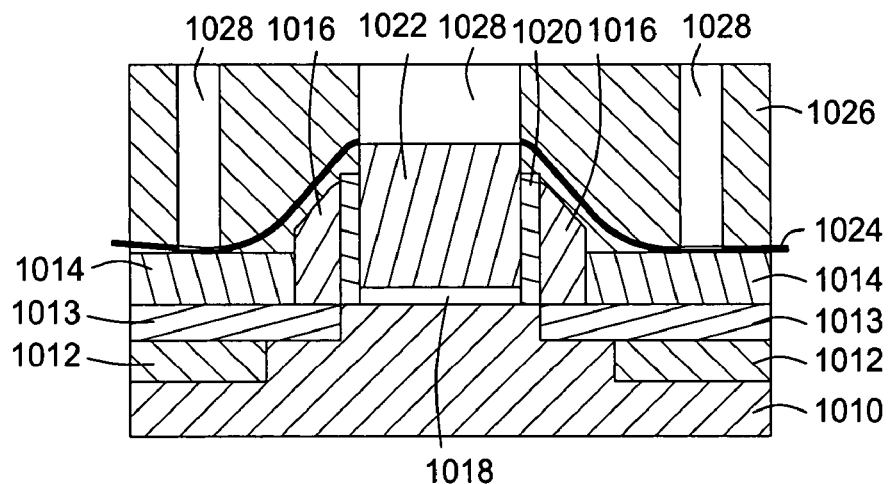
Figure 11:
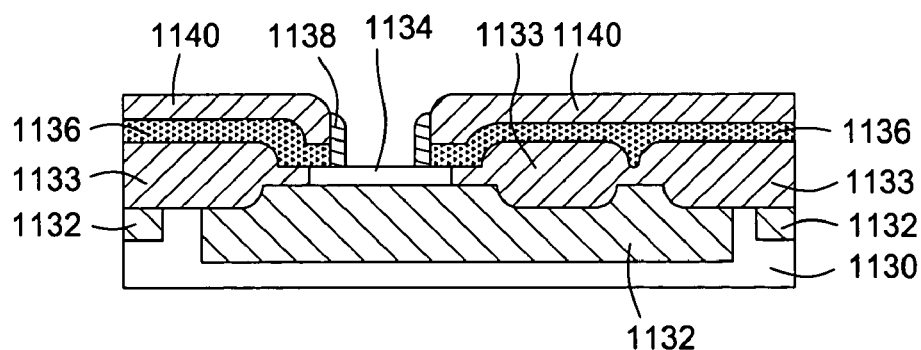
FIG. 11 is a cross section of an exemplary bi-polar transistor having a silicon nitride layer at least partially deposited utilizing the methods of FIGS. 9A-B.

In some embodiments, silicon nitride materials may be deposited as various layers in MOSFET and bipolar transistors as depicted in FIGS. 10A-B and 11. For example, FIG. 10A shows silicon nitride materials deposited within a MOSFET containing both recessed and elevated source/drains. Source/drain layer 1012 is formed by ion implantation of the substrate 1010. Generally, the substrate 1010 is doped n-type while the source/drain layer 1012 is doped p-type material. Silicon-containing layer 1013, usually Si, SiGe or SiGeC, is selectively and epitaxially grown on the source/drain layer 1012 or directly on substrate 1010 by CVD methods. Silicon-containing layer 1014 is also selectively and epitaxially grown on the silicon-containing layer 1013 by CVD methods. A gate barrier layer 1018 bridges the segmented silicon-containing layer 1013. Generally, gate barrier layer 1018 may be composed of silicon oxide, silicon oxynitride, hafnium oxide or hafnium silicate. Partially encompassing the gate barrier layer 1018 is a spacer 1016, which is usually an isolation material such as a nitride/oxide/nitride stack (e.g., Si$_3$N$_4$/SiO$_2$/Si$_3$N$_4$). Alternatively, spacer 1016 may be a homogeneous layer of a silicon nitride material, such as silicon nitride or silicon oxynitride deposited by the various methods described herein. Gate electrode layer 1022 (e.g., polysilicon) may have a spacer 1016 and off-set layers 1020 disposed on either side. Off-set layers 1020 may be composed of a silicon nitride material, such as silicon nitride, deposited by the various processes described herein.

FIG. 10B shows etch stop layer 1024 for source/drain and gate contact via etch deposited over a MOSFET. Etch stop layer 1024 may be composed of a silicon nitride material, such as silicon nitride, deposited by the various methods described herein. A pre-metal dielectric layer 1026 (e.g., silicon oxide) is deposited on etch stop layer 1024 and contains contact hole vias 1028 formed thereon.

In another embodiment, FIG. 11 depicts deposited silicon nitride material as several layers within a bipolar transistor using various embodiments of the invention. The silicon-containing compound layer 1134 is deposited on an n-type collector layer 1132 previously deposited on substrate 1130. The transistor further includes isolation layer 1133 (e.g., SiO$_2$, SiO$_x$N$_y$, or Si$_3$N$_4$), contact layer 1136 (e.g., heavily doped poly-Si), off-set layer 1138 (e.g., Si$_3$N$_4$), and a second isolation layer 1140 (e.g., SiO$_2$, SiO$_x$N$_y$, or Si$_3$N$_4$). Isolation layers 1133 and 1140 and off-set layer 1138 may be independently deposited as a silicon nitride material, such as silicon oxynitride, silicon carbon nitride, and/or silicon nitride deposited by the various processes described herein. In one embodiment, the isolation layers 1133 and 1140 are silicon oxynitride and off-set layer 1138 is silicon nitride.

Thus, a method for depositing a silicon-containing layer, such as silicon nitride, using photoexcitation has been provided. The method described above is suitable for device fabrication having small critical dimensions requiring low thermal budgets due to the use of deposition temperatures less than about 550 degrees Celsius, which advantageously facilitates robust circuit fabrication using sub 90 nm technology.

While the foregoing is directed to embodiments of the present invention, other and further embodiments of the invention may be devised without departing from the basic scope thereof, and the scope thereof is determined by the claims that follow.

What is claimed is:

1. A method for depositing a silicon and nitrogen-containing film on a substrate, the method comprising:
   positioning a substrate on a substrate support disposed in a processing chamber;
   generating beam or flux of energy of between about 1 to about 10 eV;
   indexing the substrate to expose different portions of the substrate to the beam of energy;
   transferring the energy to a surface of the substrate in the processing chamber;
   heating the substrate;
   flowing a nitrogen-containing chemical into the processing chamber;
   flowing a silicon-containing chemical with silicon-nitrogen bonds into the processing chamber; and
   depositing a silicon and nitrogen-containing film on the heated substrate disposed in the processing chamber, wherein the step of transferring further comprises:
   photoexciting the surface of the substrate prior to deposition of the silicon and nitrogen-containing film.

2. The method of claim 1, wherein the step of transferring further comprises:
   flowing an energy delivery gas through the beam of energy within the processing chamber.

3. The method of claim 2, wherein the energy delivery gas is at least one of Ne, Ar, Kr, Xe, ArBr, ArCl, KBr, KCl, KrF, $XeF_2$, $XeCl_2$ and $XeBr_2$.

4. The method of claim 1 further comprising:
   rotating the substrate to expose different portions of the substrate to the beam of energy.

5. The method of claim 1, wherein the step of transferring further comprises:
   flowing an energy delivery gas through the beam of energy; and
   flowing the energized energy delivery gas into the processing chamber prior to deposition of the silicon and nitrogen-containing film.

6. The method of claim 5, wherein the energy delivery gas is at least one of nitrogen or hydrogen.

7. The method of claim 1, wherein the step of generating the beam of energy further comprises:
   generating a first beam or flux of energy having a first wavelength; and
   generating a second beam or flux of energy having a second wavelength.

8. The method of claim 7, wherein the step of generating further comprises:
   generating the first beam or flux of energy using a first lamp; and
   generating the second beam or flux of energy using a second lamp housed remotely from the first lamp.

9. The method of claim 1, wherein the step of heating further comprises:
   heating the substrate to a temperature less than about 550 degrees Celsius.

10. A method for depositing a silicon and nitrogen-containing film on a substrate, the method comprising:
    positioning a substrate on a substrate support disposed in a processing chamber;
    generating beam or flux of energy of between about 1 to about 10 eV;
    transferring the energy to a surface of the substrate in the processing chamber;
    heating the substrate;
    flowing a nitrogen-containing chemical into the processing chamber;
    flowing a silicon-containing chemical with silicon-nitrogen bonds into the processing chamber; and
    depositing a silicon and nitrogen-containing film on the heated substrate disposed in the processing chamber, wherein the step of transferring further comprises:
    photoexciting the surface of the substrate prior to deposition of the silicon and nitrogen-containing film, wherein the step of photoexciting the surface of the substrate further comprises removing native oxides from the surface of the substrate; and wherein the step of removing native oxides from the surface of the substrate further comprises flowing a polycyclic aromatic hydrocarbon into the processing chamber in the presence of the beam or flux of energy.

11. The method of claim 10, wherein the beam has an energy level between about 2 to about 10 eV.

12. A method for depositing a silicon and nitrogen-containing film on a substrate, the method comprising:
    positioning a substrate on a substrate support disposed in a processing chamber;
    generating beam or flux of energy of between about 1 to about 10 eV;
    changing the angle of incidence defined between of the beam or flux of energy and the substrate surface;
    transferring the energy to a surface of the substrate in the processing chamber;
    heating the substrate;
    flowing a nitrogen-containing chemical into the processing chamber;
    flowing a silicon-containing chemical with silicon-nitrogen bonds into the processing chamber; and
    depositing a silicon and nitrogen-containing film on the heated substrate disposed in the processing chamber, wherein the step of transferring further comprises:
    photoexciting the surface of the substrate prior to deposition of the silicon and nitrogen-containing film.

13. A method for depositing a silicon and nitrogen-containing film on a substrate, the method comprising:
    positioning a substrate on a substrate support disposed in a processing chamber;
    generating beam or flux of energy of between about 1 to about 10 eV;
    exposing the substrate to the beam of energy at an incidence angle of less than about 90 degrees;
    transferring the energy to a surface of the substrate in the processing chamber;
    heating the substrate;
    flowing a nitrogen-containing chemical into the processing chamber;
    flowing a silicon-containing chemical with silicon-nitrogen bonds into the processing chamber; and
    depositing a silicon and nitrogen-containing film on the heated substrate disposed in the processing chamber, wherein the step of transferring further comprises:
    photoexciting the surface of the substrate prior to deposition of the silicon and nitrogen-containing film.

14. A method for depositing a silicon and nitrogen-containing film on a substrate, the method comprising:

positioning a substrate on a substrate support disposed in a processing chamber;

generating beam or flux of energy of between about 1 to about 10 eV;

transferring generated energy to the surface of the substrate in the processing chamber prior to deposition of the silicon and nitrogen-containing film;

heating the substrate;

flowing a nitrogen-containing chemical into the processing chamber;

flowing a silicon-containing chemical with silicon-nitrogen bonds into the processing chamber; and depositing a silicon and nitrogen-containing film on the heated substrate disposed in the processing chamber, wherein the step of transferring further comprises photoexciting the surface of the substrate prior to deposition of the silicon and nitrogen-containing film; and transferring generated energy to the surface of the substrate in the processing chamber after the deposition of the silicon and nitrogen-containing film.

15. A method for depositing a silicon and nitrogen-containing film on a substrate, the method comprising:

positioning a substrate on a substrate support disposed in a processing chamber;

generating beam or flux of energy of between about 1 to about 10 eV;

transferring the energy to a surface of the substrate in the processing chamber;

heating the substrate;

flowing a nitrogen-containing chemical into the processing chamber;

flowing a silicon-containing chemical with silicon-nitrogen bonds into the processing chamber; and depositing a silicon and nitrogen-containing film on the heated substrate disposed in the processing chamber, wherein the step of transferring further comprises:

photoexciting the surface of the substrate prior to deposition of the silicon and nitrogen-containing film, wherein the steps of generating and transferring further comprises:

flowing an energy delivery gas through a first beam or flux of energy;

flowing the energized energy delivery gas into the processing chamber prior to deposition of the silicon and nitrogen-containing film; and photoexciting the surface of the substrate disposed in the processing chamber with a second beam or flux of energy after the deposition of the silicon and nitrogen-containing film.

16. A method for depositing a silicon and nitrogen-containing film on a substrate, the method comprising:

positioning a substrate on a substrate support disposed in a processing chamber;

generating beam or flux of energy of between about 1 to about 10 eV;

transferring the energy to a surface of the substrate in the processing chamber;

heating the substrate;

flowing a nitrogen-containing chemical into the processing chamber;

flowing a silicon-containing chemical with silicon-nitrogen bonds into the processing chamber; and depositing a silicon and nitrogen-containing film on the heated substrate disposed in the processing chamber, wherein the step of transferring further comprises:

photoexciting the surface of the substrate prior to deposition of the silicon and nitrogen-containing film, wherein the steps of generating and transferring further comprises:

flowing a first energy delivery gas through a first beam or flux of energy;

flowing the energized first energy delivery gas into the processing chamber prior to deposition of the silicon and nitrogen-containing film;

flowing a second energy delivery gas through a second beam or flux of energy; and flowing the energized second energy delivery gas into the processing chamber after deposition of the silicon and nitrogen-containing film.

17. A method for depositing a silicon and nitrogen-containing film on a substrate, the method comprising:

positioning a substrate on a substrate support disposed in a processing chamber;

generating beam or flux of energy of between about 1 to about 10 eV;

transferring the energy to a surface of the substrate in the processing chamber;

heating the substrate;

flowing a nitrogen-containing chemical into the processing chamber;

flowing a silicon-containing chemical with silicon-nitrogen bonds into the processing chamber; and depositing a silicon and nitrogen-containing film on the heated substrate disposed in the processing chamber, wherein the step of transferring further comprises:

photoexciting the surface of the substrate prior to deposition of the silicon and nitrogen-containing film, wherein the steps of generating and transferring further comprises:

photoexciting the surface of the substrate disposed in the processing chamber with a first beam or flux of energy prior to deposition of the silicon and nitrogen-containing film; and photoexciting the surface of the substrate disposed in the processing chamber with a second beam or flux of energy after the deposition of the silicon and nitrogen-containing film.

18. A method for depositing a silicon and nitrogen-containing film on a substrate, the method comprising:

positioning a substrate on a substrate support disposed in a processing chamber;

generating beam or flux of energy of between about 1 to about 10 eV;

transferring the energy to a surface of the substrate in the processing chamber;

heating the substrate;

flowing a nitrogen-containing chemical into the processing chamber;

flowing a silicon-containing chemical with silicon-nitrogen bonds into the processing chamber; and depositing a silicon and nitrogen-containing film on the heated substrate disposed in the processing chamber, wherein the step of transferring further comprises:

photoexciting the surface of the substrate prior to deposition of the silicon and nitrogen-containing film, wherein the steps of generating and transferring further comprises:

photoexciting the surface of the substrate disposed in the processing chamber with a first beam or flux of energy prior to deposition of the silicon and nitrogen-containing film;

flowing a second energy delivery gas through a second beam or flux of energy; and flowing the energized second energy delivery gas into the processing chamber after deposition of the silicon and nitrogen-containing film.

* * * * *